(12) United States Patent  (10) Patent No.: US 7,585,706 B2
Nishii et al.  (45) Date of Patent: Sep. 8, 2009

(54) METHOD OF FABRICATING A SEMICONDUCTOR DEVICE

(75) Inventors: Katsunori Nishii, Osaka (JP); Kaoru Inoue, Shiga (JP); Toshinobu Matsuno, Kyoto (JP); Yoshito Ikeda, Osaka (JP); Hiroyuki Masato, Osaka (JP)

(73) Assignee: Panasonic Corporation, Osaka (JP)

( * ) Notice: Subject to any disclaimer, the term of this patent is extended or adjusted under 35 U.S.C. 154(b) by 196 days.

(21) Appl. No.: 11/898,951

(22) Filed: Sep. 18, 2007

(65) Prior Publication Data

US 2008/0038856 A1 Feb. 14, 2008

Related U.S. Application Data

(62) Division of application No. 09/813,304, filed on Mar. 21, 2001, now Pat. No. 7,285,806.

(30) Foreign Application Priority Data

Mar. 22, 2000 (JP) ............................. 2000-080242

(51) Int. Cl.
 *H01L 21/336* (2006.01)
(52) U.S. Cl. ................... 438/142; 438/172; 438/180; 438/197; 438/585; 257/192; 257/194; 257/195; 257/197; 257/198; 257/E21.407; 257/E21.452; 257/E29.091
(58) Field of Classification Search .............. 438/142, 438/172, 180, 197, 585; 257/192, 194, 195, 257/197, 198, E21.407, E21.452, E29.091
See application file for complete search history.

(56) References Cited

U.S. PATENT DOCUMENTS

| | | | |
|---|---|---|---|
| 4,325,182 A | 4/1982 | Tefft et al. | |
| 4,436,770 A | 3/1984 | Nishizawa et al. | |
| 5,030,583 A | 7/1991 | Beetz | |
| 5,604,763 A | 2/1997 | Kato et al. | |
| 5,929,467 A | 7/1999 | Kawai et al. | |
| 6,093,965 A | 7/2000 | Nakamura et al. | |

(Continued)

FOREIGN PATENT DOCUMENTS

EP 1 137 072 A2 9/2001

(Continued)

OTHER PUBLICATIONS

Office Action dated Apr. 20, 2007 issued in corresponding Chinese patent application No. 200510109947.7.

(Continued)

*Primary Examiner*—Fernando L Toledo
(74) *Attorney, Agent, or Firm*—Nixon Peabody LLP; Jeffrey L. Costellia

(57) ABSTRACT

The semiconductor device of this invention includes an active region formed from a group III nitride semiconductor grown on a substrate and an insulating oxide film formed in a peripheral portion of the active region by oxidizing the group III nitride semiconductor. On the active region, a gate electrode in Schottky contact with the active region extending onto the insulating oxide film and having an extended portion on the insulating oxide film is formed, and ohmic electrodes respectively serving as a source electrode and a drain electrode are formed with space from side edges along the gate length direction of the gate electrode.

16 Claims, 23 Drawing Sheets

U.S. PATENT DOCUMENTS

| | | | |
|---|---|---|---|
| 6,127,272 | A | 10/2000 | Weitzel et al. |
| 6,140,169 | A | 10/2000 | Kawai et al. |
| 6,204,512 | B1 | 3/2001 | Nakamura et al. |
| 6,207,976 | B1 | 3/2001 | Takahashi et al. |
| 6,373,188 | B1 | 4/2002 | Johnson et al. |
| 6,433,355 | B1 | 8/2002 | Riess et al. |
| 2002/0119610 | A1 | 8/2002 | Nishii et al. |

FOREIGN PATENT DOCUMENTS

| | | |
|---|---|---|
| JP | 48 076478 | 10/1973 |
| JP | 05 218011 | 8/1993 |
| JP | 7-142404 | 6/1995 |
| JP | 09 232522 | 9/1997 |
| JP | 10 041502 | 2/1998 |
| JP | 10 223901 | 8/1998 |
| JP | 10-326750 | 8/1998 |
| JP | 11-501463 | 2/1999 |
| JP | 11-163334 | 6/1999 |
| JP | 11 186253 | 7/1999 |
| JP | 2000-164926 | 6/2000 |
| WO | WO 96/42114 | 12/1996 |
| WO | WO 97/24752 | 7/1997 |

OTHER PUBLICATIONS

Office Action dated Dec. 8, 2006 issued in corresponding Korean patent application.

LEOS1998, CLEO98 Conference—Technical Digest Summary of papers presented at the conference, May 3-8, 1998, p. 153.

Office Action from People's Republic of China.

Kuromitsu et al., "*Development of a Surface-Treatment Method for AlN Substrates to Improve Adhesion With Thick-Film Conductors*", Journal of Adhesion Science and Technology, vol. 12, No. 1, pp. 105-119, 1998.

Masato et al., "*Novel High Drain Breakdown Voltage AlGaN/GaNHFETs Using Selective Thermal Oxidation Process* ", International Electron Devices Meeting 2000, pp. 377-380.

Readinger et al., "*An Investigation of the Thermal Oxides on Gallium Nitride Grown Under Various Oxidizing Ambients*" Electrochemical Society Proceedings, vol. 98-18, pp. 215-224, Nov. 1998.

European Search Report Dated Sep. 29, 2003.

"Notice of Reason for Rejections" No. 2000-080242 dated Oct. 16, 2007 from the Japanese Patent Office. (with Translation).

METHOD OF FABRICATING A SEMICONDUCTOR DEVICE

This application is a Divisional of application Ser. No. 09/813,304 filed Mar. 21, 2001, now Issued.

BACKGROUND OF THE INVENTION

The present invention relates to a semiconductor device including a group III nitride semiconductor represented by a general formula, $In_xAl_yGa_{1-x-y}N$ (wherein $0 \leq x \leq 1$, $0 \leq y \leq 1$ and $0 \leq x+y \leq 1$), and more particularly, it relates to a semiconductor device including an oxide film formed by oxidizing a group III nitride semiconductor and a method of fabricating the same.

A group III nitride semiconductor having a composition of $In_xAl_yGa_{1-x-y}N$, that is, the so-called gallium nitride-based (GaN-based) compound semiconductor, is regarded as a promising material for a light emitting device such as an LED and a semiconductor laser diode because the interband transition of electrons is direct transition therein and its band gap is varied in a wide range between 1.95 eV and 6 eV.

Recently, particularly in order to realize higher density and higher integration of information processing equipment, semiconductor laser diodes capable of outputting light of a wavelength in a blue-violet region are earnestly developed. Also, since GaN has high breakdown field, high thermal conductivity and a high electron saturation velocity, it is a promising material also for a high frequency power device. In particular, a heterojunction structure including aluminum gallium nitride (AlGaN) and gallium nitride (GaN) has an electron velocity twice as large as that of gallium arsenide (GaAs) at high electric field as high as $1 \times 10^5$ V/cm to realize down sizing, and hence is expected a high frequency operation of a device.

Since a group III nitride semiconductor exhibits an n-type characteristic when doped with an n-type dopant including a group IV element such as silicon (Si) and germanium (Ge), application to a field effect transistor (FET) is now under development. Also, since a group III nitride semiconductor exhibits a p-type characteristic when doped with a p-type dopant including a group III element such as magnesium (Mg), barium (Ba) and calcium (Ca), application to an LED and a semiconductor laser diode including a pn-junction structure of a p-type semiconductor and an n-type semiconductor is now under development. As an applicable electronic device, a high electron mobility transistor (HEMT) including a heterojunction of, for example, AlGaN and GaN is widely being examined to be realized by using a group III nitride semiconductor having a high electron transporting property.

Now, a conventional AlGaN/GaN-based HEMT will be described with reference to drawings.

FIGS. 23A and 23B show the conventional AlGaN/GaN-based HEMT, wherein FIG. 23A shows the plane structure thereof and FIG. 23B shows the cross-sectional structure thereof taken on line XXIIIB-XXIIIB of FIG. 23A. As is shown in FIGS. 23A and 23B, a first HEMT 100A and a second HEMT 100B are formed on a substrate 101 of silicon carbide (SiC) so as to be separated by a scribe region 110, used for dividing the substrate 101 into chips each including a transistor.

Each of the first HEMT 100A and the second HEMT 100B includes, on a buffer layer 102 of GaN grown on the substrate 101, an active region 103 formed by mesa-etching a heterojunction layer of AlGaN/GaN.

On each active region 103, a gate electrode 104 in Schottky contact with the active region 103 and ohmic electrodes 105, in ohmic contact with the active region 103, disposed with space from side edges along the gate length direction of the gate electrode 104 are formed.

A portion above and around each active region 103 including the gate electrode 104 and the ohmic electrodes 105 is entirely covered with an insulating film 106, and pad electrodes 107 respectively electrically connected to the gate electrode 104 and the ohmic electrodes 105 are formed on each insulating film 106. The insulating film 106 is covered with a surface passivation film 108 with the pad electrodes 107 exposed.

The insulating film 106 covering the active region 103 is generally formed from silicon oxide or the like, so as to protect the surface of the active region 103 and ease formation of the gate electrode 104 by a lift off method.

As is shown in FIG. 23A, since it is necessary to provide the gate electrode 104 with an extended portion 104a to be connected to the pad electrode 107, the gate electrode 104 is formed not only on the active region 103 but also on the buffer layer 102 of GaN exposed by the mesa-etching.

In the conventional AlGaN/GaN-based HEMT, however, contact between the extended portion 104a and the buffer layer 102 is contact between a metal and a semiconductor, namely, the so-called Schottky contact, and hence, there is a problem that a leakage current tends to occur due to damage of the semiconductor surface caused in the mesa-etching. This leakage current largely affects a pinch-off characteristic of the transistor, resulting in degrading the transistor characteristic.

Furthermore, since adhesion between the buffer layer 102 of GaN and the insulating film 106 of silicon oxide is insufficient, there is another problem that the insulating film 106 peels off in wire-bonding the pad electrodes 107 formed on the insulating film 106.

Moreover, both the substrate 101 of SiC and the GaN-based semiconductor have high hardness, and hence, it is very difficult to conduct a scribe process for dividing the substrate into chips as compared with the case where Si and GaAs are used. Therefore, the yield may be lowered due to occurrence of a crack reaching the active region 103 in the scribe process or the reliability may be lowered due to peeling of the surface passivation film 108 or the insulating film 106 in the vicinity of the scribe region 110.

In a semiconductor laser diode having a laser structure formed by multi layers of group III nitride semiconductors, a substrate of sapphire is generally used. In the case where sapphire is used as the substrate, it is difficult to form a cavity structure by cleavage because of a difference in the crystal axis between sapphire and the laser structure formed on the sapphire, and hence, the cavity structure is frequently formed by dry etching. When the cavity is formed by dry etching, however, a defect peculiar to the formed cavity facet is caused so as to form a non-luminescent center. As a result, there arises a problem that the operation current (threshold current) may increase or the reliability may be lowered.

SUMMARY OF THE INVENTION

The present invention was devised for overcoming the aforementioned conventional problems, and an object of the invention is forming an insulating film having high adhesion to a group III nitride semiconductor, a good electric characteristic or a good optical characteristic.

In order to achieve the object, a semiconductor device including a group III nitride semiconductor of this invention has an oxide film formed by directly oxidizing the group III nitride semiconductor itself.

Specifically, the first semiconductor device of this invention comprises an active region formed on a substrate from a group III nitride semiconductor; and an insulating oxide film formed in a peripheral portion of the active region on the substrate by oxidizing the group III nitride semiconductor.

The bonding strength between a group III nitride semiconductor and an oxide film formed from an oxide of the group III nitride semiconductor is approximately three times as large as the bonding strength between, for example, a group III nitride semiconductor and a silicon oxide film. Accordingly, the adhesion between the insulating oxide film and the substrate or between the insulating oxide film and the active region is high in the first semiconductor device, so as to prevent the insulating oxide film and the like from peeling off. As a result, the yield and the reliability of the semiconductor device can be improved.

In the first semiconductor device, a gate electrode, and a source electrode and a drain electrode sandwiching the gate electrode are preferably formed on the active region. In this manner, a field effect transistor of the group III nitride semiconductor can be obtained.

In this case, the gate electrode preferably extends from the active region onto the insulating oxide film. In this manner, even when a portion of the gate electrode positioned on the insulating oxide film is used as an extended portion of the gate electrode, the extended portion is not in Schottky contact with the insulating oxide film formed by oxidizing the group III nitride semiconductor. Therefore, a leakage current can be prevented from flowing in the extended portion, resulting in improving the reliability of the device.

The second semiconductor devices of this invention plural in the number comprise a group III nitride semiconductor formed in a plurality of device formation regions each surrounded with a scribe region on a substrate in a wafer state; and a protection oxide film formed in a peripheral portion of the scribe region on the substrate by oxidizing the group III nitride semiconductor.

In the second semiconductor devices, in dividing the plural semiconductor devices formed on one wafer into chips, an insulating film covering the device formation region can be prevented from peeling off and cracks can be prevented from occurring in the device formation region, resulting in improving the yield and the reliability of the devices.

The third semiconductor device of this invention comprises a pad electrode formed on a substrate; and an insulating oxide film formed between the substrate and the pad electrode by oxidizing a group III nitride semiconductor.

Since the bonding strength between a group III nitride semiconductor and an insulating oxide film formed from the group III nitride semiconductor is larger than the bonding strength between a group III nitride semiconductor and a silicon oxide film or the like. Therefore, the pad electrode can be prevented from peeling off from the substrate in the third semiconductor device, resulting in improving the yield and the reliability of the device.

The fourth semiconductor device of this invention comprises a laser structure formed on a substrate and having a cavity including a plurality of group III nitride semiconductors; and a protection oxide film formed on side faces of the laser structure including facets of the cavity by oxidizing the group III nitride semiconductors.

In the fourth semiconductor device, a mirror face of a cavity mirror is not an etched facet but is formed from an interface between the etched facet and the protection oxide film, and hence, the mirror face is never affected by a defect caused in etching. In addition, the group III nitride semiconductor is directly oxidized, and hence, a leakage current derived from a defective facet coating can be avoided, resulting in attaining high reliability.

The first method of fabricating a semiconductor device of this invention comprises a semiconductor layer forming step of forming a group III nitride semiconductor layer on a substrate; a protection film forming step of forming, on the group III nitride semiconductor layer, a protection film for covering an active region of the group III nitride semiconductor layer; an oxide film forming step of forming, in a region on the substrate excluding the active region, an insulating oxide film by oxidizing the group III nitride semiconductor layer with the protection film used as a mask; and an active region exposing step of exposing the active region by removing the protection film.

In the first method of fabricating a semiconductor device, the insulating oxide film is formed in the region on the substrate excluding the active region by oxidizing the group III nitride semiconductor layer with the protection film used as a mask. Therefore, the first semiconductor device of this invention can be definitely fabricated.

The first method of fabricating a semiconductor device of this invention preferably further comprises, after the active region exposing step, an ohmic electrode forming step of forming an ohmic electrode on the active region; and a gate electrode forming step of forming, on the active region, a gate electrode extending onto the insulating oxide film.

The first method of fabricating a semiconductor device of this invention preferably further comprises, between the semiconductor layer forming step and the protection film forming step, an ammonia treatment step of exposing the group III nitride semiconductor laser to ammonia. In this manner, an oxide or the like remaining on the surface of a device formation region to be used as the active region is removed and cleaned by ammonia, and hence, the contact resistance ratio of the active region can be lowered. As a result, the electric characteristic of the device can be improved.

In this case, the ammonia treatment step preferably includes a sub-step of changing the ammonia into plasma.

The second method of fabricating a semiconductor device of this invention comprises a semiconductor layer forming step of forming a group III nitride semiconductor layer on a substrate in a wafer state; a region setting step of setting, in the group III nitride semiconductor layer, a plurality of device formation regions where devices are to be formed on the group III nitride semiconductor layer and a scribe region for used in dividing the substrate into chips respectively including the device formation regions; a protection film forming step of forming, on the scribe region, a protection film for covering the scribe region; and an oxide film forming step of forming, in a region on sides of the scribe region on the substrate, a protection oxide film by oxidizing the group III nitride semiconductor layer with the protection film used as a mask.

In the second method of fabricating a semiconductor device, since the protection oxide film is formed on sides of the scribe region on the substrate, the second semiconductor device of this invention in which the insulating film covering the device formation region can be prevented from peeling off and cracks can be prevented from occurring in the device formation region can be definitely fabricated.

In the first or second method of fabricating a semiconductor device, the protection film is preferably formed from silicon, silicon oxide or silicon nitride.

The third method of fabricating a semiconductor device of this invention comprises a semiconductor layer forming step of forming a group III nitride semiconductor layer on a substrate; a region setting step of setting, in the group III nitride semiconductor layer, a device formation region where a device is to be formed on the group III nitride semiconductor layer and a pad electrode formation region for external connection of the device to be formed in the device formation region; a protection film forming step of forming a protection film covering a region on the group III nitride semiconductor layer excluding the pad electrode formation region; an oxide film forming step of forming an insulating oxide film in the pad electrode formation region on the substrate by oxidizing the group III nitride semiconductor layer with the protection film used as a mask; and a step of forming a pad electrode on the insulating oxide film.

In the third method of fabricating a semiconductor device, the insulating oxide film is formed in the pad electrode formation region on the substrate by oxidizing the group III nitride semiconductor layer with the protection film used as a mask. Accordingly, the third semiconductor device of the invention can be definitely fabricated.

In any of the first through third methods of fabricating a semiconductor device, the oxide film forming step preferably includes a sub-step of conducting a thermal treatment on the group III nitride semiconductor layer in an oxygen ambient.

In any of the first through third methods of fabricating a semiconductor device, the oxide film forming step preferably includes a sub-step of conducting a thermal treatment on the group III nitride semiconductor layer with oxygen ions implanted.

The fourth method of fabricating a semiconductor device of this invention comprises a laser structure forming step of forming, on a substrate, a laser structure having a cavity and including a plurality of group III nitride semiconductor layers by forming the plurality of group III nitride semiconductor layers; a step of exposing facets of the cavity of the laser structure; and an oxide film forming step of forming a protection oxide film on the facets by oxidizing side faces of the laser structure including the facets.

In the fourth method of fabricating a semiconductor device, the protection oxide film is formed on both side faces of the laser structure including the facets of the cavity by oxidizing the group III nitride semiconductor layers. Therefore, the fourth semiconductor device of the invention can be definitely fabricated. Also, since a procedure for forming facet coating can be omitted, the fabrication can be simplified.

In the fourth method of fabricating a semiconductor device, the oxide film forming step preferably includes a sub-step of conducting a thermal treatment on the group III nitride semiconductor layers in an oxygen ambient.

BRIEF DESCRIPTION OF THE DRAWINGS

FIGS. 1A and 1B are diagrams of a GaN-based oxide-isolated HEMT according to Embodiment 1 of the invention, wherein FIG. 1A is a plane view thereof and FIG. 1B is a cross-sectional view thereof taken on line IB-IB of FIG. 1A;

FIGS. 9A, 9B and 9C show AES atomic profiles in a depth direction of a substrate of the oxide-isolated HEMT of Embodiment 1, wherein FIG. 9A is a graph of the insulating oxide film obtained after conducting a thermal treatment and removing a protection film, FIG. 93 is a graph of the active region masked with the protection film and FIG. 9C is a graph for comparison of the multi-layer structure not subjected to the thermal treatment;

FIGS. 20A and 20B are diagrams of a group III nitride semiconductor laser diode according to Embodiment 4 of the invention, wherein FIG. 20A is a perspective view thereof and FIG. 20B is a cross-sectional view thereof taken on line XXB-XXB of FIG. 20A;

FIGS. 21A, 21B and 21C are diagrams for showing a method of fabricating the semiconductor laser diode of Embodiment 4, wherein FIG. 21A is a cross-sectional view attained after epitaxial growth, FIG. 21B is a cross-sectional view taken on line XXIB-XXIB of FIG. 21C and FIG. 21C is a front view of a laser structure;

FIGS. 23A and 23B are diagrams of a conventional GaN-based semiconductor device in a wafer state, wherein FIG. 23A is a plane view thereof and FIG. 23B is a cross-sectional view thereof taken on line XXIIIB-XXIIIB of FIG. 23A;

DETAILED DESCRIPTION OF THE INVENTION

Embodiment 1

Embodiment 1 of the invention will now be described with reference to the accompanying drawings.

Figure 1A:
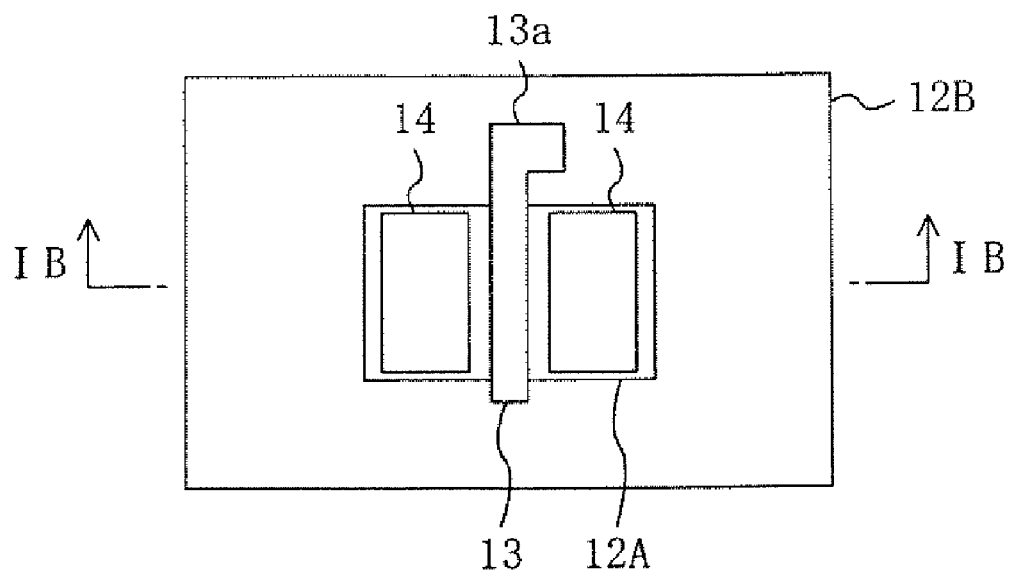
Figure 1B:
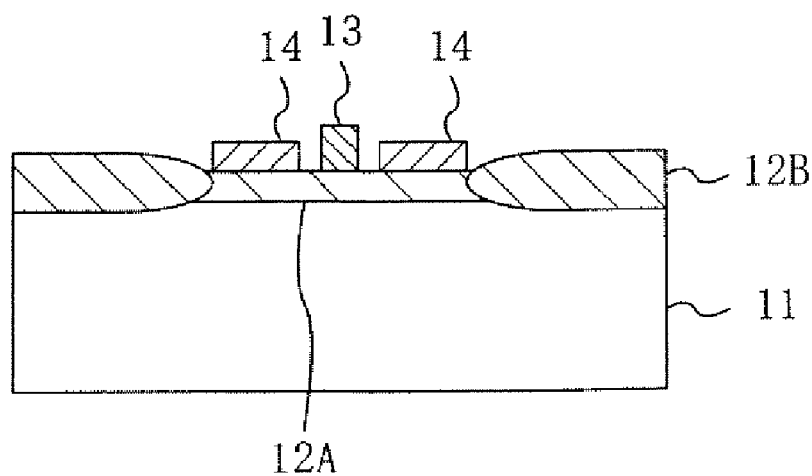

FIGS. 1A and 1B show an HEMT including a group III nitride semiconductor, particularly, an oxide-isolated HEMT in which devices are isolated by a GaN-based oxide, according to Embodiment 1 of the invention, wherein FIG. 1A is a plane view thereof and FIG. 1B is a cross-sectional view thereof taken on line IB-IB of FIG. 1A. As is shown in FIGS. 1A and 1B, the HEMT of this embodiment includes an active region 12A of a GaN-based semiconductor grown on a substrate 11 of, for example, silicon carbide (SiC) and an insulating oxide film 12B formed around the active region 12A by oxidizing the GaN-based semiconductor.

On the active region 12A, a gate electrode 13 in Schottky contact with the active region 12A is formed so as to extend onto the insulating oxide film 12B and have an extended portion 13a on the insulating oxide film 12B, and ohmic electrodes 14 respectively serving as a source electrode and a drain electrode are formed with space from the side edges along the gate length direction of the gate electrode 13.

Figure 23A:
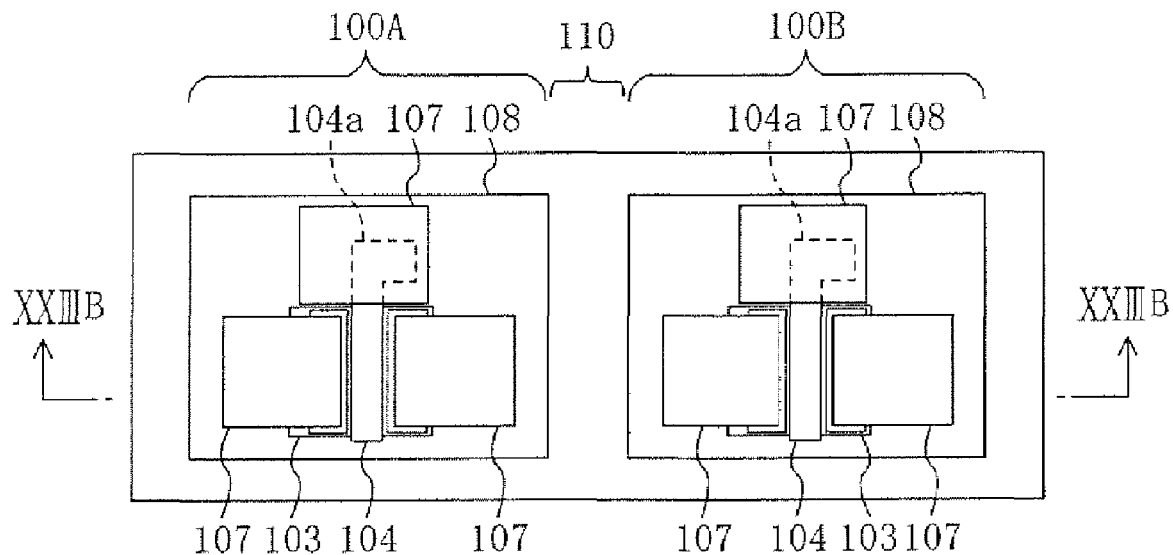
Figure 23B:
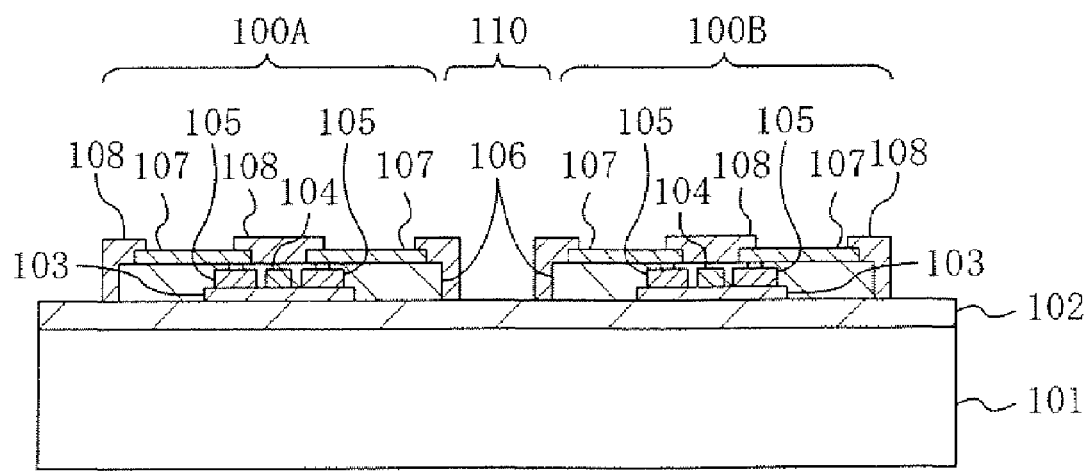
Figure 24:
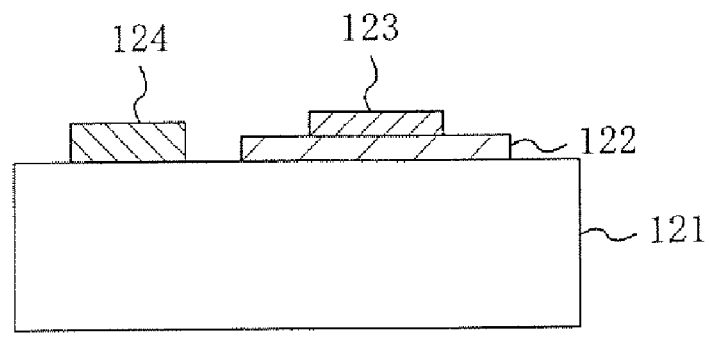
FIG. 24 is a cross-sectional view of a pseudo device for simulating a conventional mesa-isolated HEMT.
Figure 25:
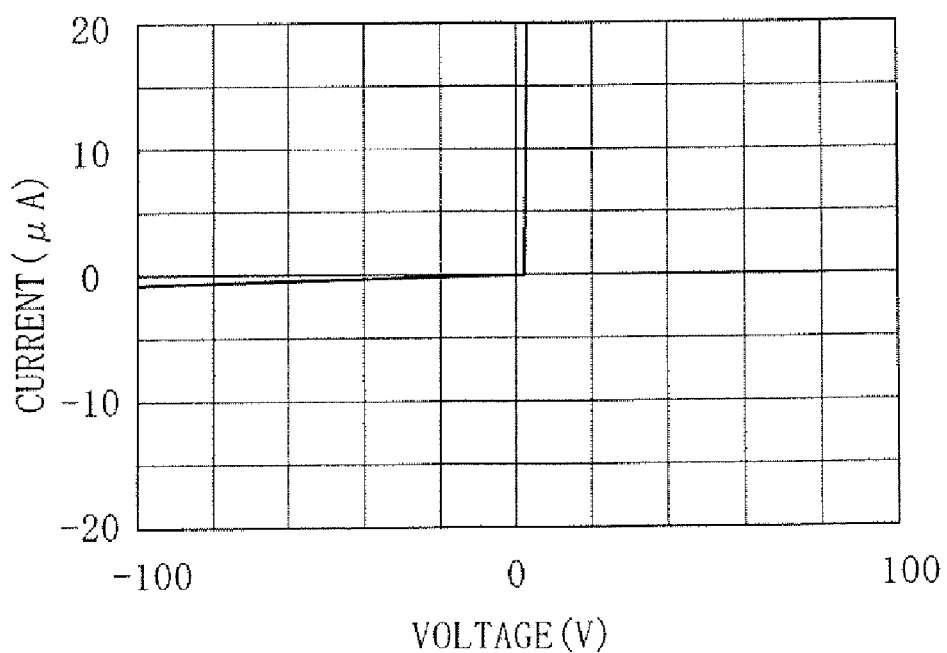
FIG. 25 is a graph for showing a voltage-current characteristic between a Schottky electrode and an ohmic electrode formed on an active region of the pseudo device of FIG. 24.

Now, a conventional mesa-isolated HEMT and the oxide-isolated HEMT of this embodiment will be compared in the voltage-current characteristic between the Schottky electrode and the ohmic electrode. FIG. 24 shows the cross-sectional structure of a pseudo device simulating the conventional mesa-isolated HEMT. Specifically, on a substrate 121 of SiC, an island-like active layer 122 of a GaN-based semiconductor, an island-like ohmic electrode 123 formed on the active layer 122 and a Schottky electrode 124 in Schottky contact with the substrate with a space from the active layer 122 are formed. In this case, the Schottky electrode 124 corresponds to the extended portion 104a shown in FIG. 23A. The pseudo device exhibits a rectified current characteristic as is shown in FIG. 25, and although the reverse breakdown voltage is large, a leakage current flows on the order of microampere (μA). In this manner, in the conventional mesa-isolated HEMT shown in FIGS. 23A and 23B, the extended portion 104a of the gate electrode 104 is formed on the buffer layer 102 of mesa-etched GaN. Therefore, the contact between the extended portion 104a of the gate electrode 104 and the buffer layer 102 is Schottky contact, so that a leakage current can easily flow.

Figure 2:
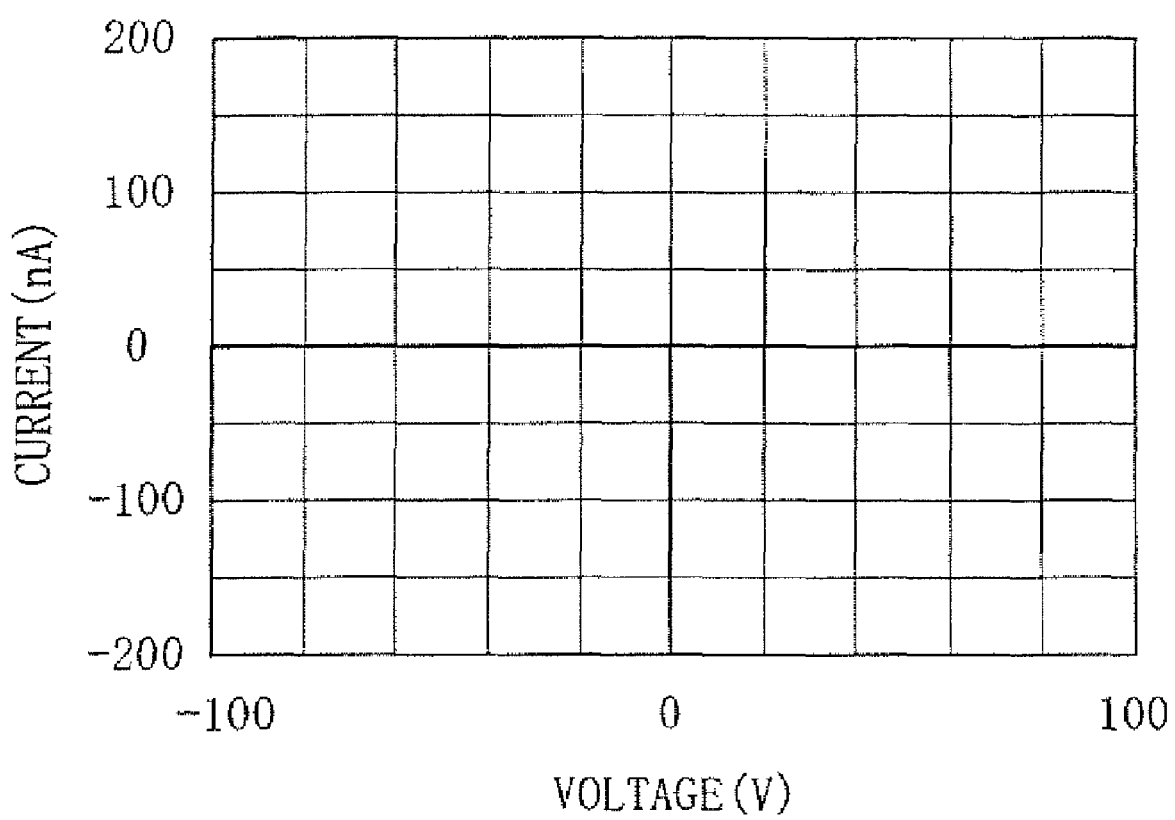
FIG. 2 is a graph for showing a voltage-current characteristic between a Schottky electrode formed on an insulating oxide film and an ohmic electrode formed on an active region in the oxide-isolated HEMT of Embodiment 1.

On the other hand, in the oxide-isolated HEMT of this embodiment, the voltage-current characteristic between the Schottky electrode 13 formed on the insulating oxide film 12B and the ohmic electrode 14 formed on the active region 12A is shown in FIG. 2. Thus, even when a voltage of 100 V or more is applied between these electrodes, merely a current on the order of nanoampere (nA) flows.

Figure 3:
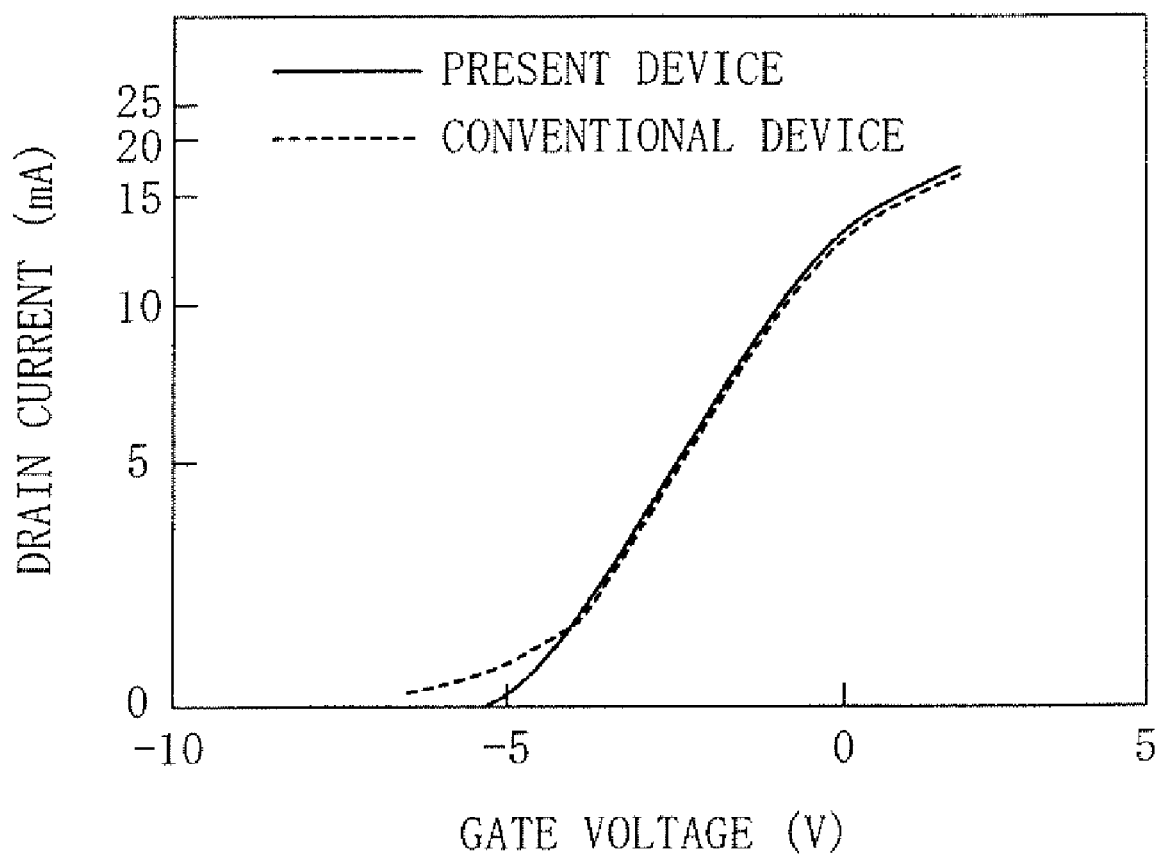
FIG. 3 is a graph for showing gate voltage dependency of a drain current in the oxide-isolated HEMT of Embodiment 1 and a conventional mesa-isolated HEMT.

FIG. 3 shows the gate voltage dependency of a drain current in the oxide-isolated HEMT of this embodiment and the conventional mesa-isolated HEMT both having a gate width of 100 μm. Although there is no particular difference in a region where the gate voltage is so high that a large drain current flows, there is a large difference in the vicinity of pinch-off where a small drain current flows. It is thus understood that the pinch-off characteristic is degraded in the conventional mesa-isolated HEMT owing to a leakage current caused in the extended portion 104a of the gate electrode 104.

In this manner, in the oxide-isolated HEMT of this embodiment, a leakage current can be avoided from flowing in the extended portion 13a of the gate electrode differently from the conventional mesa-isolated HEMT, so that the HEMT can attain a good pinch-off characteristic.

Furthermore, in the oxide-isolated HEMT of this embodiment, the insulating oxide film 12B is formed by oxidizing the group III nitride semiconductor (GaN) used for forming the active region 12A, and therefore, a level difference like that of the mesa-isolated HEMT is never caused in the boundary between the side edge portion of the active region 12A and the insulating oxide film 12B but the boundary is smooth. In the gate electrode 104 of the conventional HEMT, there is a fear of the so-called level disconnection that the gate electrode 104 is disconnected due to a level difference between the side edge of the active region 103 and the top face of the buffer layer 102 during, for example, the fabrication. On the contrary, there is no fear of the level disconnection in this embodiment owing to the smooth boundary, resulting in attaining high reliability.

Although the HEMT is described in this embodiment, the same effects can be attained in any device requiring isolation, such as a field effect transistor (MESFET) and a hetero bipolar transistor (HBT).

Although the substrate of silicon carbide (SiC) is used in the HEMT of this embodiment, any substrate on which an active region of a group III nitride semiconductor can be epitaxially grown, such as a sapphire substrate, may be used instead.

Now, a method of fabricating the oxide-isolated HEMT having the aforementioned structure will be described with reference to the accompanying drawings.

FIGS. 4A through 4C and 5A through 5C are cross-sectional views for showing procedures in the method of fabricating the oxide-isolated HEMT of this embodiment.

Figure 4A:
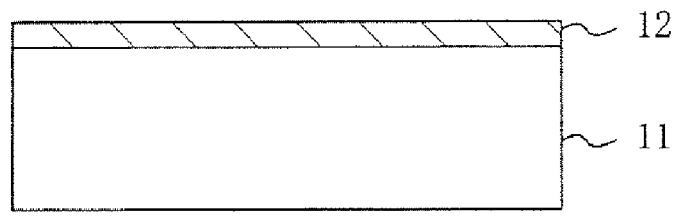
FIGS. 4A, 4B and 4C are cross-sectional views for showing procedures in a method of fabricating the oxide-isolated HEMT of Embodiment 1.

First, as is shown in FIG. 4A, a multi-layer structure 12 of GaN/AlGaN is formed on a substrate 11 of SiC by, for example, electron beam epitaxy (MBE). The detailed structure of the multi-layer structure 12 will be described later.

Figure 4B:
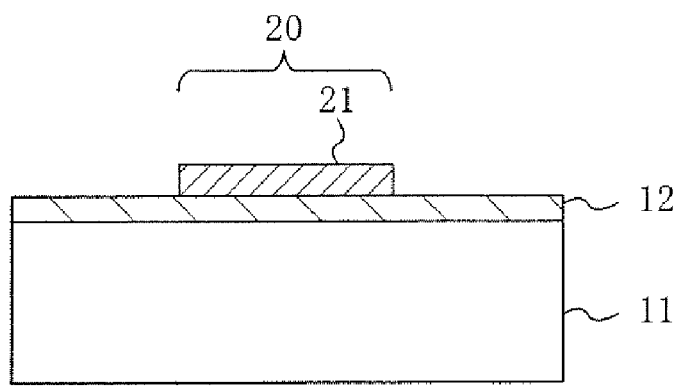

Next, as is shown in FIG. 4B, a protection formation film of silicon (Si) is formed on the entire surface of the multi-layer structure 12 by, for example, chemical vapor deposition (CVD) or the MBE. Thereafter, the protection formation film is patterned by lithography into a protection film 21 covering an island-like active formation region 20 on the multi-layer structure 12.

Figure 4C:
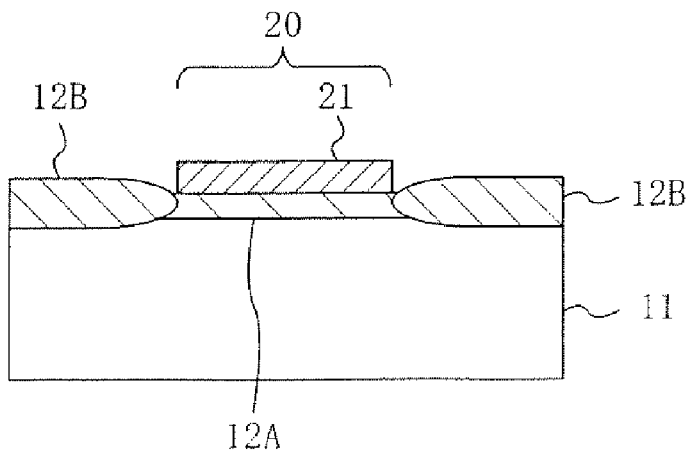

Then, as is shown in FIG. 4C, with the protection film 21 formed on the multi-layer structure 12, a thermal treatment is carried out at approximately 900° C. in an oxygen ambient for approximately 1 hour. Thus, a portion of the multi-layer structure 12 excluding an active region 12A is oxidized into an insulating oxide film 12B.

Figure 5A:
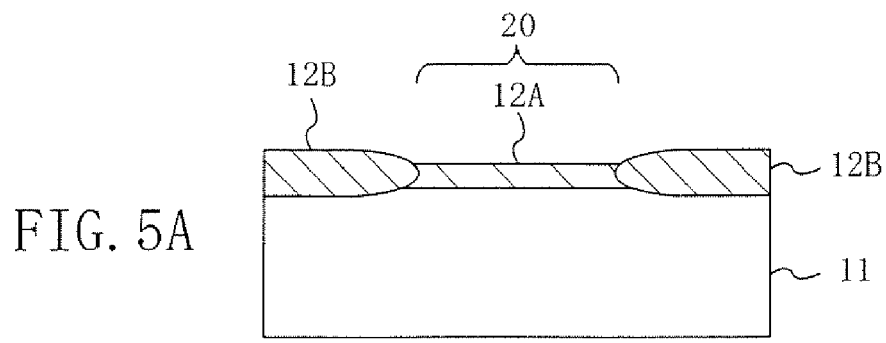
FIGS. 5A, 5B and 5C are cross-sectional views for showing other procedures in the method of fabricating the oxide-isolated HEMT of Embodiment 1.
Figure 5B:
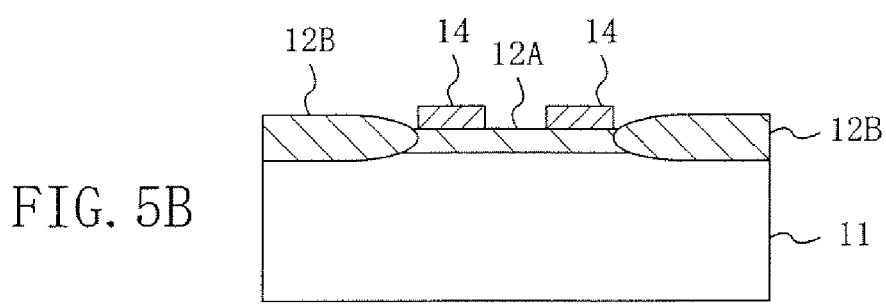

Subsequently, as is shown in FIG. 5A, the protection film 21 is removed by using nitric acid/hydrogen fluoride, so as to expose the active region 12A. Thereafter, as is shown in FIG. 5B, ohmic electrodes 14 of titanium (Ti)/aluminum (Al) are selectively formed on the active region 12A by deposition and lithography.

Figure 5C:
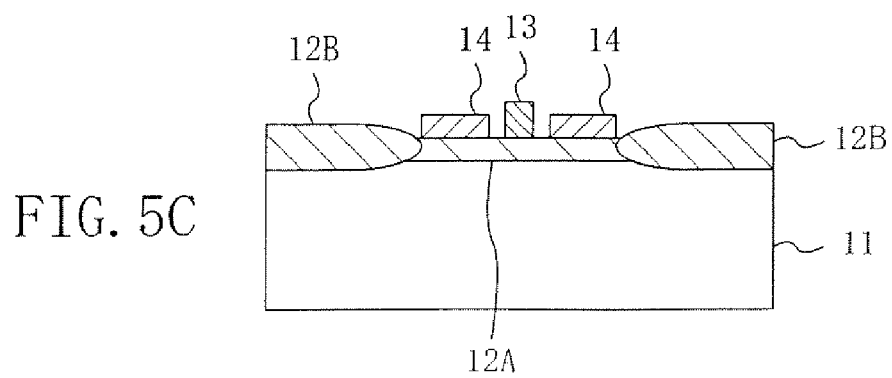

Next, as is shown in FIG. 5C, a gate electrode 13 of, for example, palladium (Pd)/titanium (Ti)/gold (Au) is selectively formed on the active region 12A by the deposition and the lithography, so as to be sandwiched by the ohmic electrodes 14 with space therebetween and to extend onto the insulating oxide film 12B. Thereafter, although not shown in the drawings, a protection insulating film of, for example, a silicon oxide film is formed above and around the active region 12A including the gate electrode 13 and the ohmic electrodes 14. Then, pad electrodes of, for example, titanium (Ti)/gold (Au) respectively electrically connected to the gate electrode 13 and the ohmic electrodes 14 are formed on the protection insulating film.

In this manner, in the HEMT of this embodiment, isolation is provided by directly oxidizing the group III nitride semiconductor used for forming the active region 12A. Next, the isolation characteristic between the active region 12A and the insulating oxide film 12B formed as described above and the substrate characteristic of the active region 12A, which are extremely significant for the operation characteristic of the HEMT, will be verified.

Figure 6:
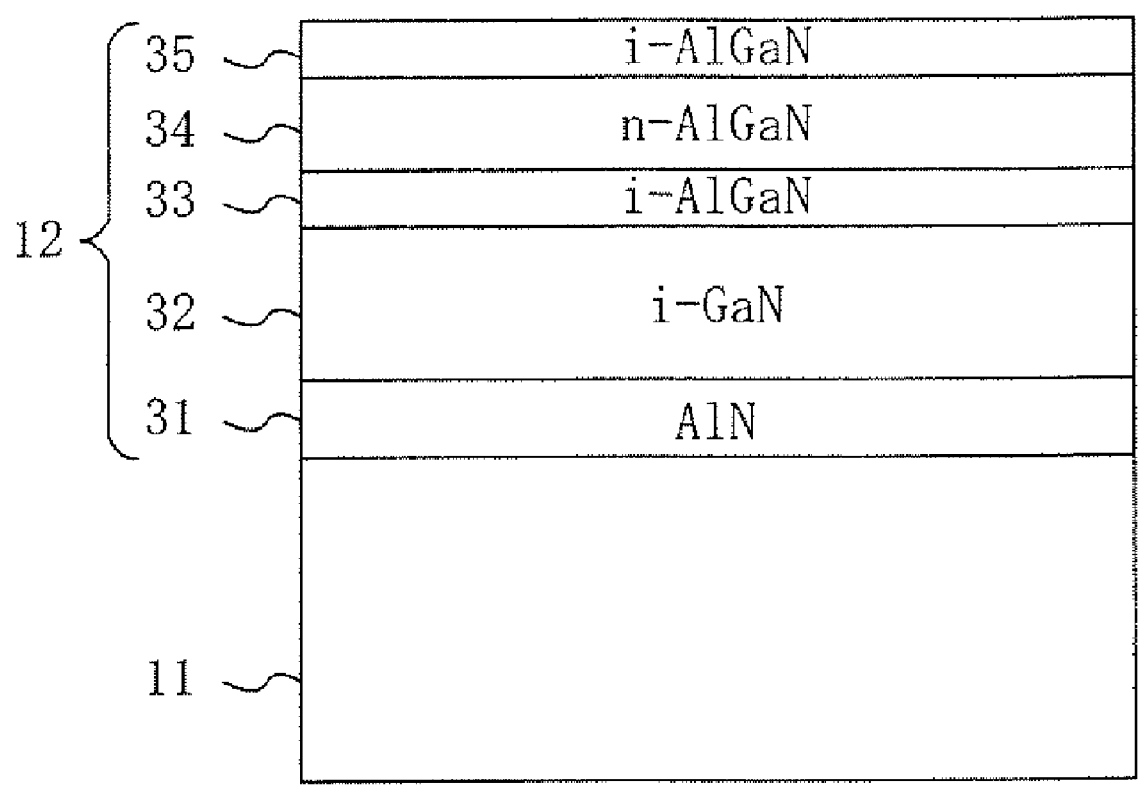
FIG. 6 is a cross-sectional view of a multi-layer structure of GaN-based semiconductors in the oxide-isolated HEMT of Embodiment 1.

FIG. 6 is a cross-sectional view of a multi-layer structure 12 used for the verification. The multi-layer structure 12 includes the following layers successively grown on a substrate 11: A buffer layer 31 of aluminum nitride (AlN) with a thickness of approximately 100 nm; an active layer 32 of intrinsic gallium nitride (GaN) with a thickness of approximately 3 μm; a first barrier layer 33 of intrinsic aluminum gallium nitride (AlGaN) with a thickness of approximately 2 nm; a second barrier layer 34 of n-type aluminum gallium nitride (AlGaN) with a thickness of approximately 25 nm; and a third barrier layer 35 of intrinsic aluminum gallium nitride (AlGaN) with a thickness of approximately 3 nm.

Figure 7:
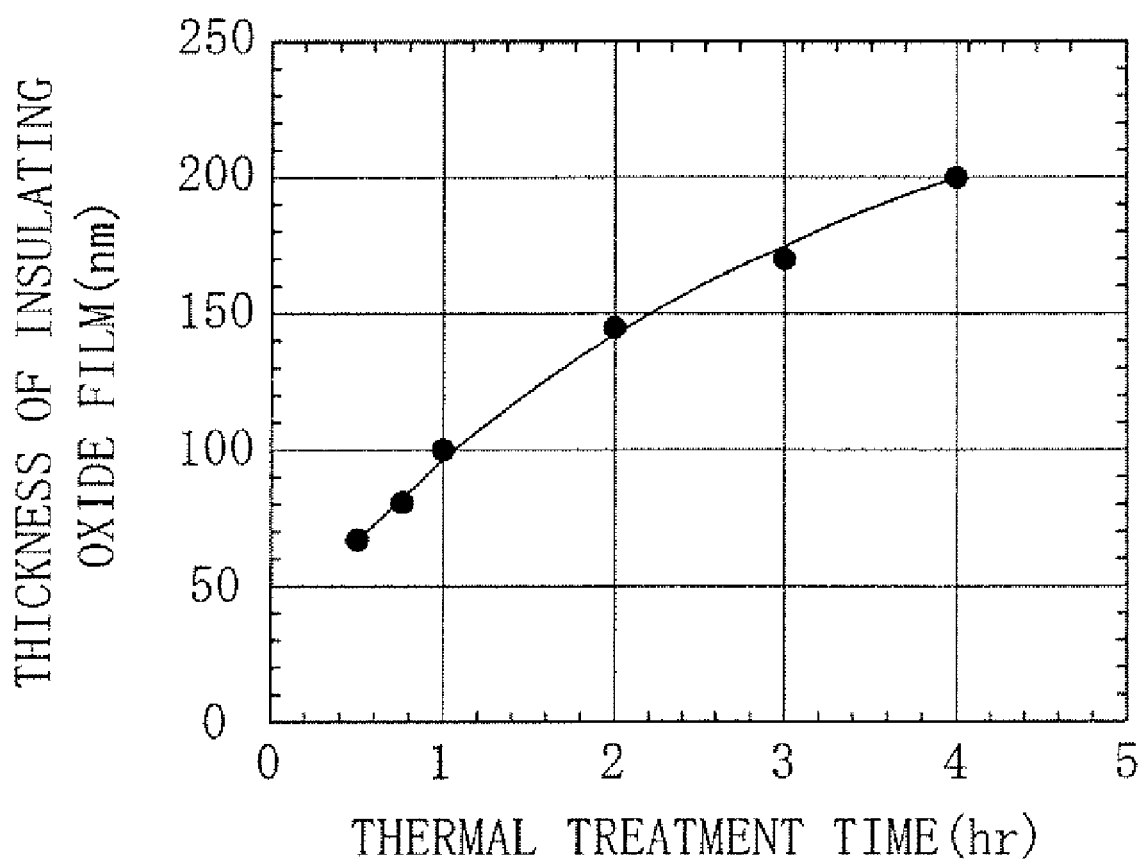
FIG. 7 is a graph for showing dependency on thermal treatment time of the thickness of the insulating oxide film in the oxide-isolated HEMT of Embodiment 1.

FIG. 7 shows the dependency on thermal treatment time of the thickness of the insulating oxide film 12B formed by subjecting the multi-layer structure 12 to a thermal treatment conducted at 900° C. in an oxygen ambient. As is shown in FIG. 7, the thermal treatment carried out for 1 hour results in forming an insulating oxide film with a thickness of approximately 100 nm, and the thermal treatment carried out for 4 hours results in forming an insulating oxide film with a thickness of approximately 200 nm. Since the total thickness of the barrier layers 33 through 35 of the HEMT is approximately 30 nm as is shown in FIG. 6, the insulating oxide film 12B with a thickness of approximately 100 nm suffices.

Figure 8:
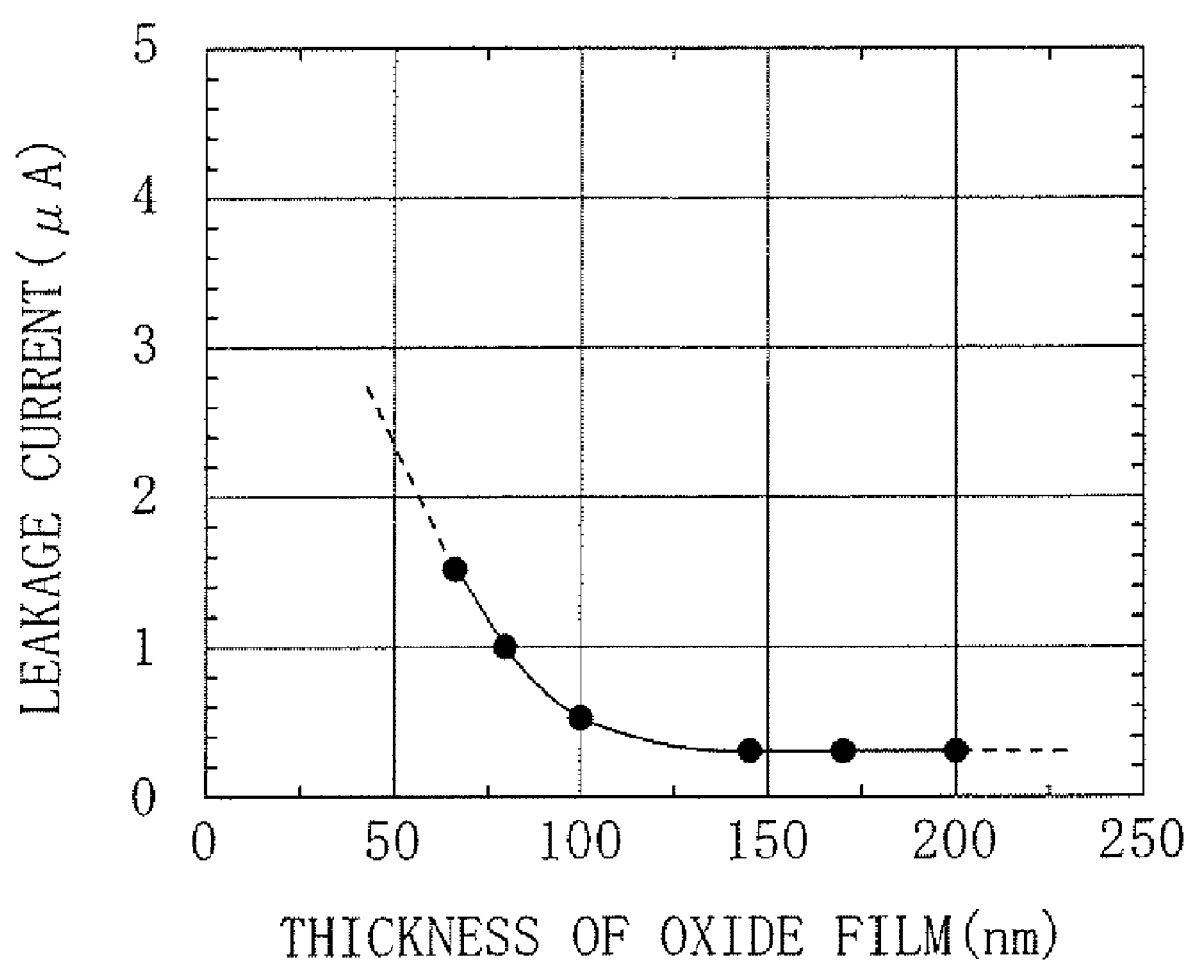
FIG. 8 is a graph for showing the relationship between the thickness of the insulating oxide film and a leakage current caused between elements in the oxide-isolated HEMT of Embodiment 1.

FIG. 8 shows the relationship between the thickness of the insulating oxide film 12B and a leakage current flowing between devices isolated by the insulating oxide film. It is understood from FIG. 8 that a satisfactory isolation characteristic can be attained when the insulating oxide film 12B has a thickness of 80 nm or more. Accordingly, as is obvious from FIGS. 7 and 8, when the thermal treatment is carried out at 900° C., the devices can be sufficiently isolated by conducting the thermal treatment approximately for 1 hour.

In forming the insulating oxide film 12B, the thermal treatment may be carried out, instead of in an oxygen ambient, with oxygen ions implanted into the multi-layer structure 12.

Next, the substrate characteristic will be verified.

The substrate characteristic of the active region 12A should never degrade through the thermal, treatment. Therefore, in order to avoid oxidation of the active region 12A through the thermal treatment, the protection film 21 is formed from silicon (Si) in this embodiment.

Figure 9A:
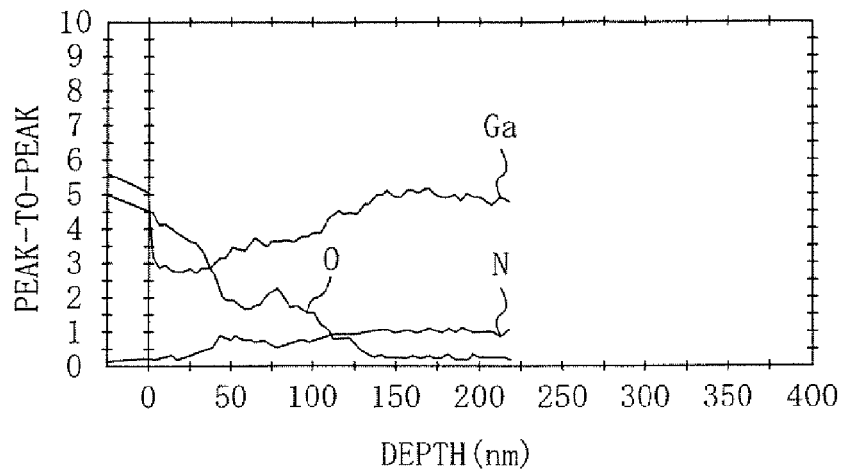
Figure 9B:
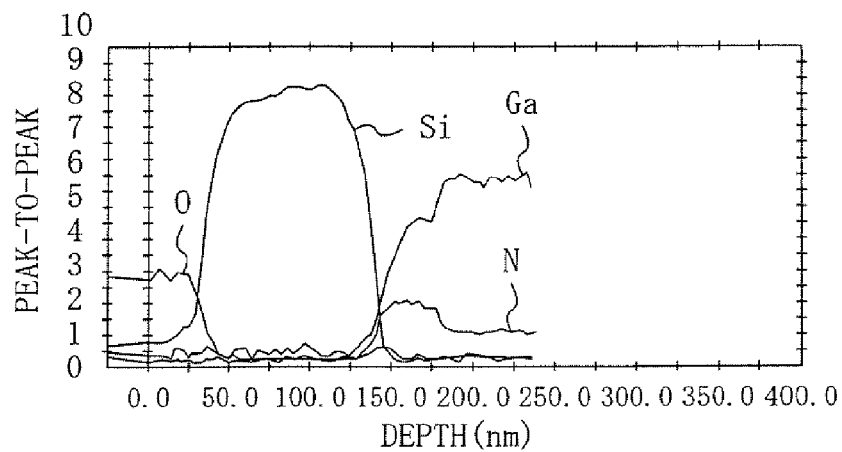
Figure 9C:
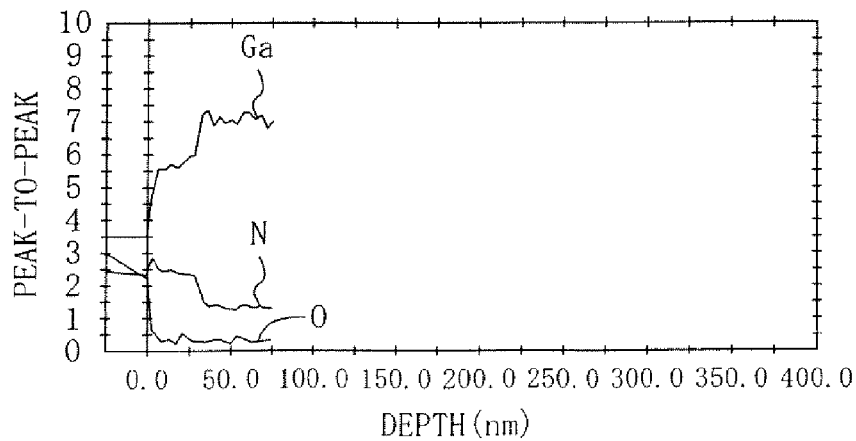

FIGS. 9A through 9C show atomic profiles along a depth direction of the substrate of the HEMT of this embodiment obtained by Auger electron spectroscopy (AES) analysis. FIG. 9A shows the profile of the isolation (insulating oxide film 12B) obtained after conducting a thermal treatment at 900° C. for 1 hour and removing the protection film 21, FIG. 9B shows the profile of the active region 12A masked with the protection film 21 with a thickness of approximately 100 nm and FIG. 9C shows, for comparison, the profile of the multi-layer structure 12 not subjected to the thermal treatment. In these graphs, "Ga" indicates the profile of gallium atoms, "N" indicates the profile of nitrogen atoms and "O" indicates the profile of oxygen atoms. Also, since attention is paid to the profile of oxygen atoms in the multi-layer structure 12, aluminum atoms in a trace quantity are omitted. In these graphs, the abscissa indicates the depth (nm) from the surface of a sample and the ordinate indicates a relative value (peak-to-peak).

As is shown in FIG. 9A, the structure of the multi-layer structure 12 prior to the thermal treatment is largely broken in the isolation, so that the oxygen atoms are diffused from the top face to the active layer 32, resulting in forming the insulating oxide film 12B. In this case, the insulating oxide film 12B has a thickness of approximately 100 nm.

Furthermore, as is shown in FIG. 9B, in the active region 12A masked with the protection film 21 of Si, although the upper portion of the protection film 21 is oxidized, there is no reaction on the interface between the protection film 21 and the active region 12A. Thus, the structure of the active region 12A prior to the thermal treatment is not changed but kept as is understood from comparison with the profile of FIG. 9C obtained without the thermal treatment.

Furthermore, Table 1 below shows the sheet carrier concentration and the carrier mobility of the multi-layer structure 12 obtained before and after the thermal treatment by a Hall measurement method at room temperature.

TABLE 1

|  | Before thermal treatment | After thermal treatment |
|---|---|---|
| Carrier concentration (cm$^{-3}$) | $1.4 \times 10^{13}$ | $1.5 \times 10^{13}$ |
| Mobility (cm$^2$/Vs) | 741 | 766 |

Neither of the sheet carrier concentration and the carrier mobility is largely changed before and after the thermal treatment. It is understood also from this result that the active region 12A is protected by the protection film 21 as is understood from the result of the AES analysis.

Furthermore, the removing process of the protection film 21 after the thermal treatment is also significant in this invention. If the protection film 21 cannot be completely removed or the active region 12A is damaged in removing the protection film 21, the transistor characteristic is degraded. In addition, the insulating oxide film 12B should never be etched in removing the protection film 21.

Accordingly, the protection film 21 of Si is removed in this embodiment by wet etching using nitric acid/hydrogen fluoride.

Figure 10:
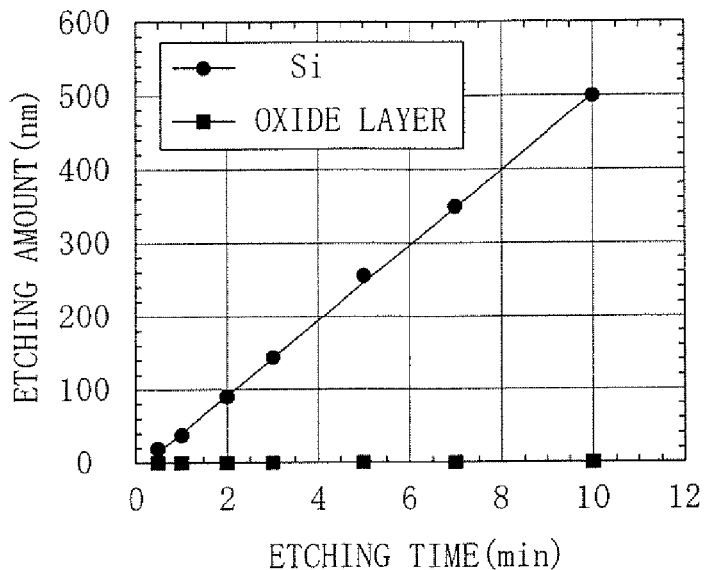
FIG. 10 is a graph for showing time dependency of the etching amount of wet etching using nitric acid/hydrogen fluoride in the protection film and the insulating oxide film conducted after the thermal treatment in the oxide-isolated HEMT of Embodiment 1.

FIG. 10 shows time dependency of the etching amount in the wet etching using nitric acid/hydrogen fluoride of the protection film 21 and the insulating oxide film 12B after the thermal treatment. As is shown in FIG. 10, although the protection film 21 is easily etched, the insulating oxide film 12B is minimally etched.

Although the protection film 21 is removed by the wet etching using nitric acid/hydrogen fluoride in this embodiment, another etchant may be used instead. Alternatively, the etching may be carried out by dry etching.

Furthermore, although the protection film 21 is formed from silicon in this embodiment, any other material capable of preventing degradation of the active region 12A through the thermal treatment, such as silicon oxide and silicon nitride, may be used instead. A solution including fluoric acid such as buffered hydrogen fluoride (BHF) may be used as the etchant when the protection film is formed from silicon oxide, and a solution including phosphoric acid such as heated phosphoric acid may be used as the etchant when the protection film is formed from silicon nitride.

Modification of Embodiment 1

A method of fabricating a semiconductor device according to one modification of Embodiment 1 will now be described with reference to the accompanying drawing. The fabrication method of this modification is characterized by including an ammonia treatment process for exposing, the top face of the multi-layer structure 12 to plasma of an ammonia gas between the process for forming the multi-layer structure shown in FIG. 4A and the process for forming the protection film shown in FIG. 4B.

Figure 11:
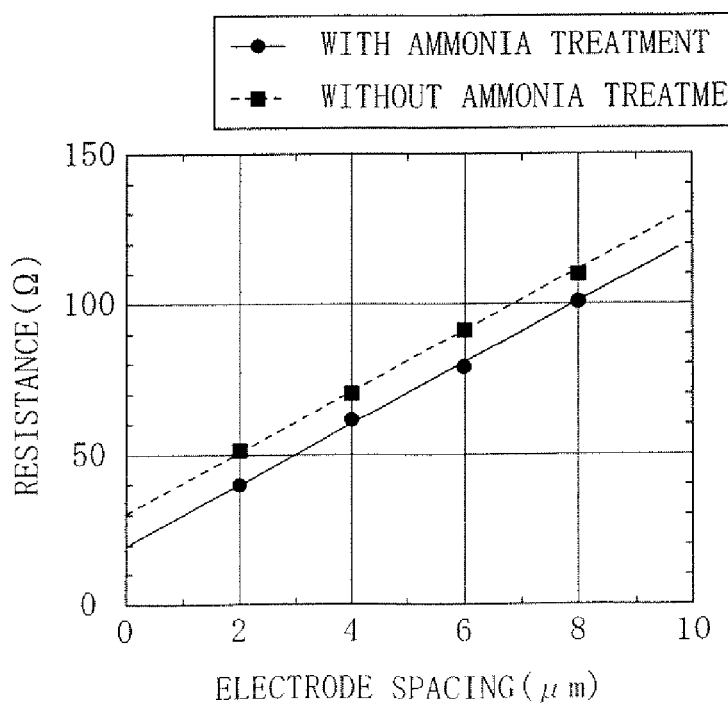
FIG. 11 is a graph for showing dependency on electrode spacing of contact resistance of the ohmic electrode with or without an ammonia treatment in the oxide-isolated HEMT of Embodiment 1.

FIG. 11 shows the result of evaluation of contact resistance of an ohmic electrode 14 formed on an active region 12A obtained by a transmission line method (TLM). In this evaluation, the ohmic electrode 14 has a width of approximately 100 μm, and the spacing between the ohmic electrodes 14 is set to 2 μm, 4 μm, 6 μm or 8 μm. The result obtained with the ammonia treatment of this modification carried out is shown with a solid line, and the result obtained without the ammonia treatment is shown with a broken line for comparison. As is shown in FIG. 11, the inclination of the line obtained with the ammonia treatment is substantially the same as that of the line obtained without the ammonia treatment, which reveals that there is no difference in the sheet resistance of the active region 12A between these cases. On the contrary, the contact resistance is lowered by approximately 30% when the ammonia treatment is carried out as compared with when it is not carried out. The contact resistance ratio obtained based on this graph is $6 \times 10^{-6}$ Ωcm$^2$, which is a satisfactory value, even when the ammonia treatment is not carried out, and is as low as $3 \times 10^{-6}$ Ωcm$^2$ when the ammonia treatment is carried out. This is because altered substances such as an oxide present on the active region 12A are removed and cleaned by the ammonia treatment.

Although the ammonia treatment is carried out by using plasma of an ammonia gas in this modification, the ammonia treatment may be carried out by boiling the multi-layer structure in an ammonia solution.

Embodiment 2

Embodiment 2 of the invention will now be described with reference to the accompanying drawings.

Figure 12:
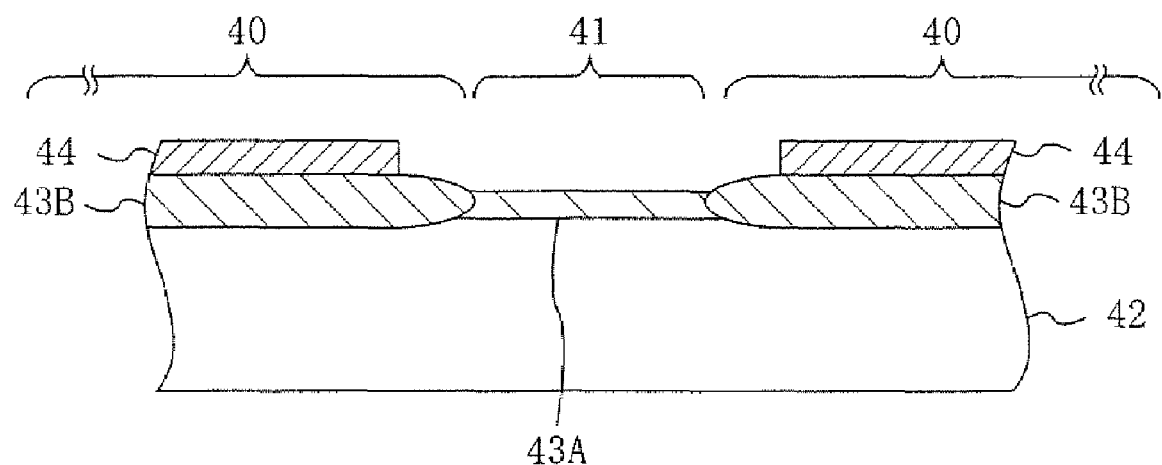
FIG. 12 is a cross-sectional view of a scribe region of a GaN-based semiconductor device in a wafer state according to Embodiment 2 of the invention.

FIG. 12 shows the cross-sectional structure of a scribe region of a GaN-based semiconductor device of Embodiment 2. The GaN-based semiconductor device of this embodiment is characterized by including a protection oxide film formed by oxidizing a GaN-based semiconductor itself in the periphery of a scribe region used in scribing a wafer bearing a plurality of semiconductor devices into chips including the respective semiconductor devices. As is shown in FIG. 12, the principal plane of a substrate 42 of, for example, SiC in a wafer state is partitioned into chip formation regions 40 and a scribe region 41 provided between the chip formation regions 40.

In the scribe region 41 on the principal plane of the substrate 42, a multi-layer structure 43A of GaN-based semiconductors to be used as an active layer for a transistor or the like in a device formation region (not shown) formed at the center of the chip formation region 40 is formed. In a peripheral portion of the scribe region 41 on the principal plane in the vicinity of the chip formation region 40, a protection oxide film 43B formed by oxidizing the multi-layer structure 43A is formed and an insulating film 44 of a silicon oxide film or the like serving as a surface protection film is formed on the protection oxide film 43B.

In a conventional GaN-based semiconductor device, a peripheral portion of a scribe region 41 is covered with an insulating film 44 of a silicon oxide film or the like having comparatively small bonding strength with a GaN-based semiconductor, and hence, the insulating film 44 is easily peeled off during scribing (division into chips). The insulating film 44 of this embodiment is formed on the protection insulating film 43B formed by oxidizing the GaN-based semiconductor having comparatively high bonding strength with the insulating film 44, and hence, occurrence of cracks in the multi-layer structure 43A and the substrate 42 and peeling of the insulating film 44 can be avoided in dividing the substrate 42 into chips.

Figure 13:
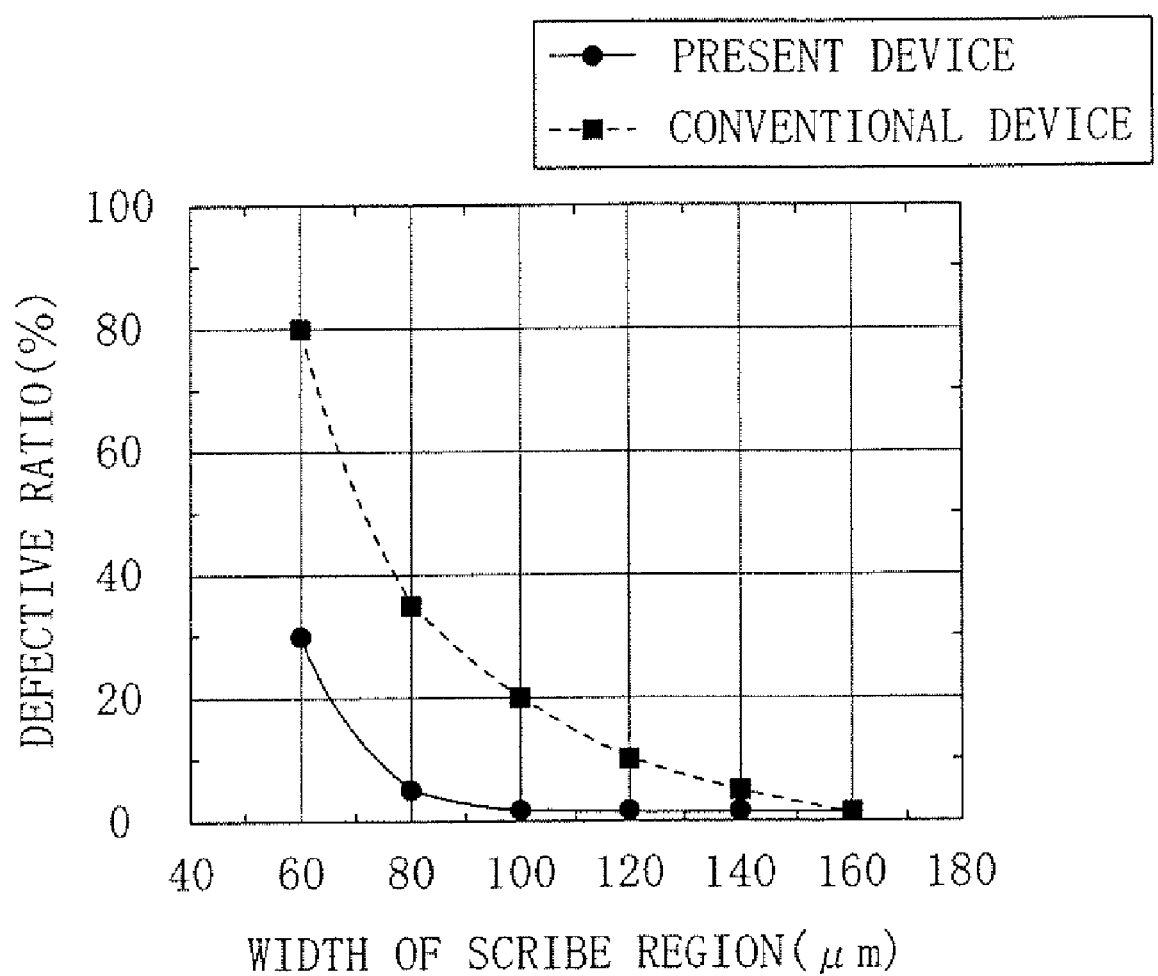
FIG. 13 is a graph for showing the relationship between a defective ratio in a scribe process and the width of the scribe region in the semiconductor device in a wafer state of Embodiment 2 and a conventional semiconductor device in a wafer state.

FIG. 13 shows the relationship, in the semiconductor device in a wafer state of this embodiment and a conventional semiconductor device in a wafer state, between the defective ratio in scribing and the width of the scribe region. Through observation of the surface of each chip obtained when the scribe region has a width of 100 μm, it is found, in the conventional semiconductor chips, that defects are caused in approximately 20% of samples, specifically, a crack caused in a multi-layer structure in the scribe region reaches the peripheral portion or inside of the chip, and the insulating film on the device formation region is peeled off.

In contrast, through observation of the surface of the chips of the semiconductor devices of this embodiment, it is found that a crack caused in the multi-layer structure 43A in the scribe region 41 stops around the boundary with the protection oxide film 43B so as not to reach the chip formation region 40.

As is understood from FIG. 13, since the protection oxide film 43A formed by oxidizing the GaN-based semiconductor is formed in the peripheral portion of the scribe region 41, even when the scribe region 41 has a width as small as approximately 100 μm, the defective ratio is lower than that in a conventional semiconductor device having a scribe region with a width of 150 μm. As a result, since the defective ratio in scribing can be suppressed in the semiconductor devices of this embodiment even when the width of the scribe region 41 is small, the number of semiconductor devices obtained from one substrate 42 (wafer) can be increased. In addition, the insulating film 44 can be prevented from peeling off, resulting in largely improving the reliability of the devices.

Figure 14:
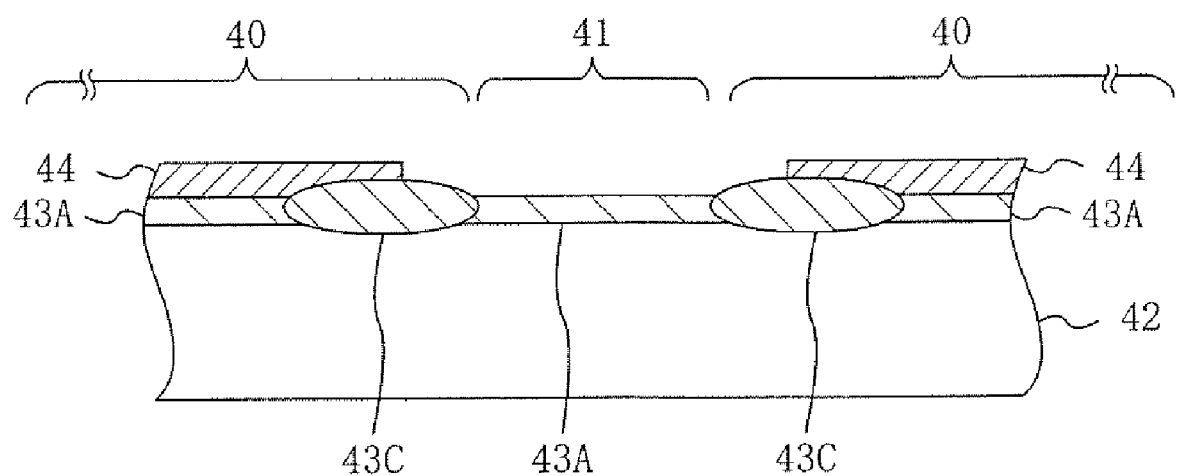
FIG. 14 is a cross-sectional view of a scribe region of a GaN-based semiconductor device in a wafer state according to a modification of Embodiment 2.

Although the protection oxide film 43B is formed also in the chip formation region 40 in this embodiment, a protection oxide film 43C may be formed instead in a circular shape along the edge of the scribe region 41 as a modification as is shown in FIG. 14. In this case, the protection oxide film 43C with a width of approximately 5 μm suffices.

Although the substrate 42 is formed from SiC in this embodiment, any substrate on which the multi-layer structure 43A of GaN-based semiconductors can be epitaxially grown, such as a sapphire substrate, may be used instead.

Now, a method of fabricating the semiconductor device having the aforementioned structure will be described with reference to the accompanying drawings.

FIGS. 15A through 15C, 16A and 16B are cross-sectional views for showing procedures in the method of fabricating the semiconductor device of this embodiment.

Figure 15A:
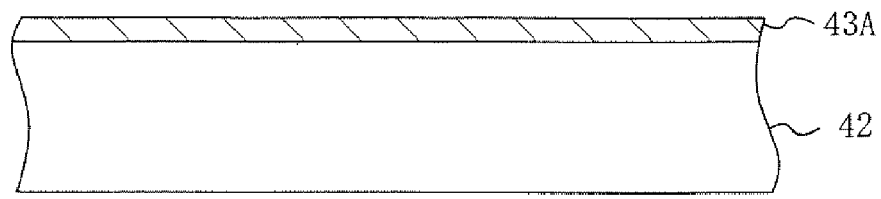
FIGS. 15A, 15B and 15C are cross-sectional views for showing procedures in a method of fabricating the semiconductor device of Embodiment 2.

First, as is shown in FIG. 15A, a multi-layer structure 43A of GaN/AlGaN is formed on a wafer-like substrate 42 of SiC by, for example, the electron beam epitaxy (MBE).

Figure 15B:
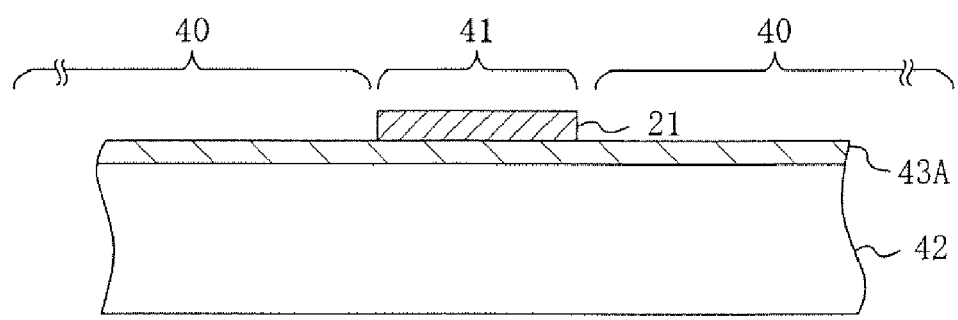

Next, as is shown in FIG. 15B, plural chip formation regions 40 and a scribe region 41 between the plural chip formation regions 40 are formed. In the scribe region 41, a protection formation film of Si is formed on the multi-layer structure 43A by the CVD or the like, and the protection formation film is patterned by the lithography-into a protection film 21 covering the scribe region 41 on the substrate 42.

Figure 15C:
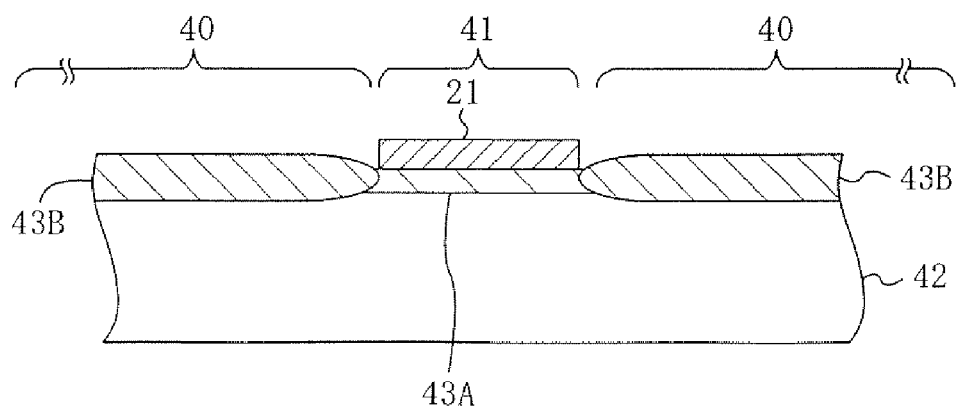

Then, as is shown in FIG. 15C, with the protection film 21 formed on the multi-layer structure 43A, a thermal treatment is carried out at approximately 900° C. in an oxygen ambient for approximately 1 hour. Thus, portions of the multi-layer structure 43A positioned in the chip formation regions 40 on both sides of the scribe region 41 are oxidized into protection oxide films 43B.

The protection oxide film 43B may be formed before or after forming a semiconductor device such as a transistor in a device formation region (not shown) at the center of the chip formation region 40, whereas it is preferably formed before forming the semiconductor device for attaining a good device characteristic because the thermal treatment is carried out at a comparatively high temperature. In this case, the protection oxide film 43B may be formed in the same procedure for forming the protection film 21 shown in FIG. 4C described in Embodiment 1.

Figure 16A:
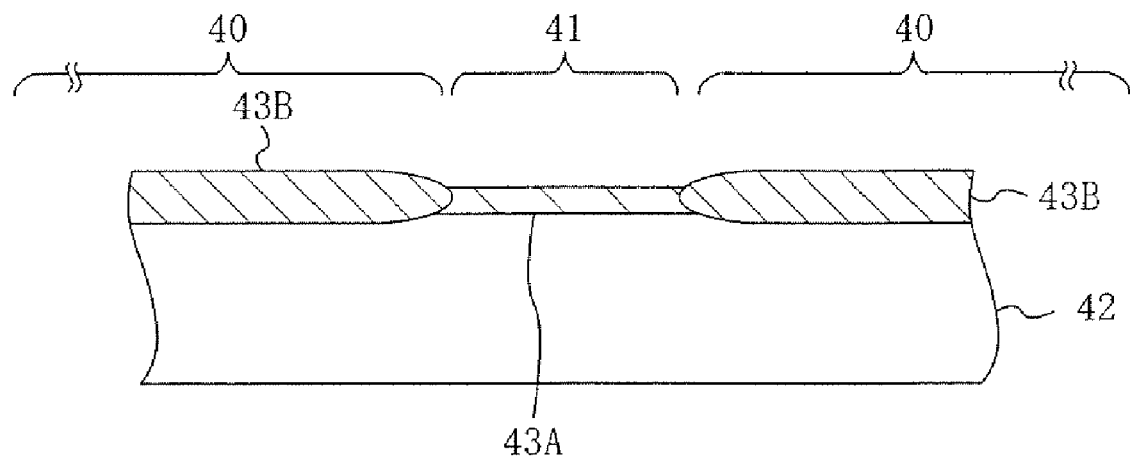
FIGS. 16A and 16B are cross-sectional views for showing other procedures in the method of fabricating the semiconductor device of Embodiment 2.
Figure 16B:
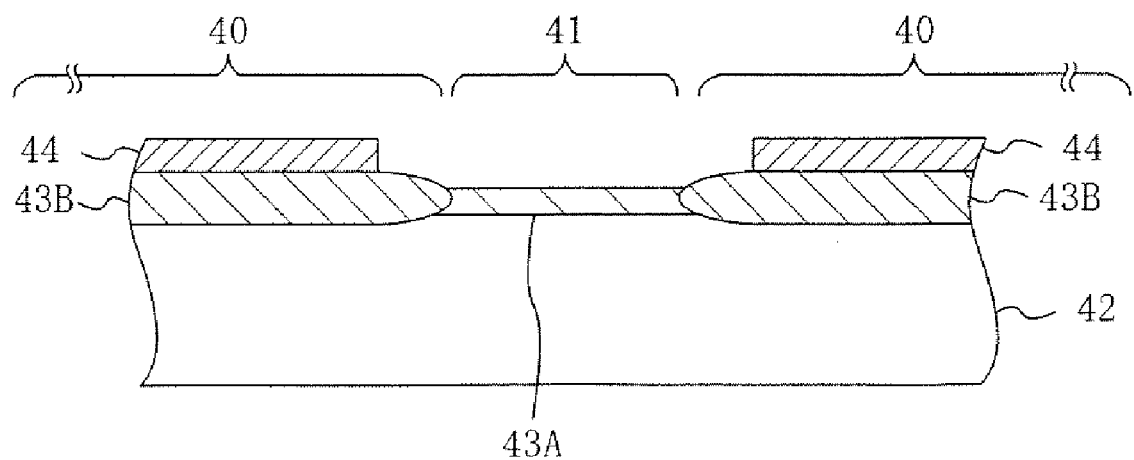

Subsequently, as is shown in FIG. 16A, the protection film 21 is removed by using nitric acid/hydrogen fluoride, and then, as is shown in FIG. 16B, an insulating film 44 of, for example, silicon oxide for surface protection is formed on the entire surface of the chip formation regions 40 by the CVD or the like. Then, the insulating film 44 is selectively etched by the lithography so as to expose the multi-layer structure 43A in the scribe region 41.

In this manner, since the protection oxide film 43B is formed from an oxide of the multi-layer structure 43A of GaN-based semiconductors in this embodiment, the adhesion between the substrate 42 and the insulating film 44 is high. Also, since the multi-layer structure 43A and the protection oxide film 43B are continuously formed in the scribe region 41, even when a crack is caused in the protection oxide film 43B in scribing the substrate 42, the crack can be prevented from reaching the peripheral portion or inside of the chip formation region 40.

Although the protection film 21 used in masking the portion of the multi-layer structure 43A in the scribe region 41 for forming the protection oxide film 43B is formed from silicon in this embodiment, the protection film 21 may be formed from any material capable of preventing degradation of the multi-layer structure 43A through the thermal treatment, such as silicon oxide and silicon nitride.

Although the protection film 21 is removed by the wet etching using nitric acid/hydrogen fluoride, another etchant may be used. Alternatively, the etching can be carried out by dry etching.

Furthermore, the thermal oxidation process for forming the protection oxide film 43B may be carried out, instead of in an oxygen ambient, by implanting oxygen ions into the multi-layer structure 43A of the GaN-based semiconductors.

Embodiment 3

Embodiment 3 of the invention will now be described with reference to the accompanying drawings.

Figure 17:
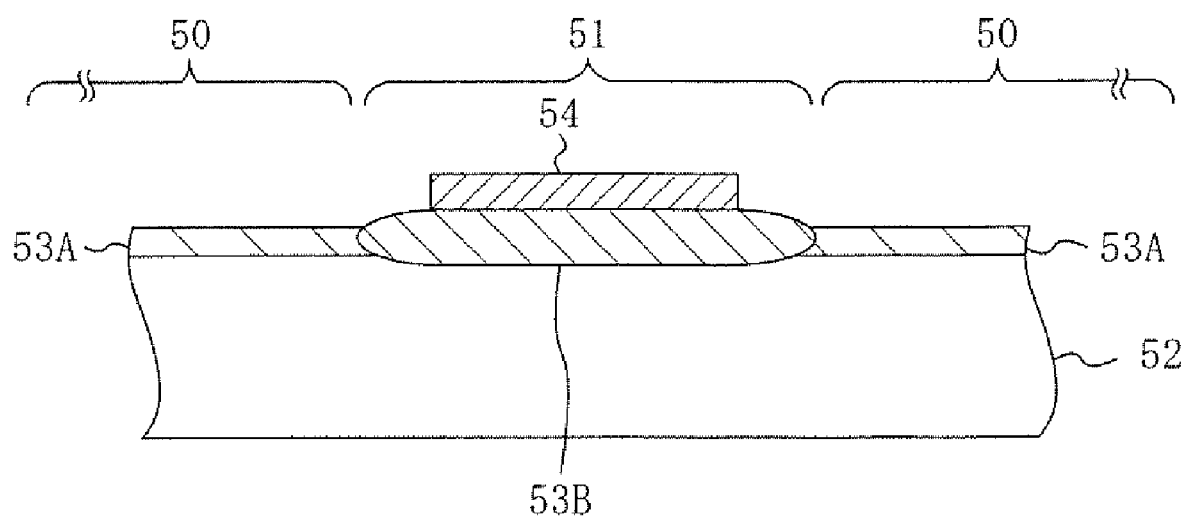
FIG. 17 is a cross-sectional view of a pad electrode portion of a GaN-based semiconductor device according to Embodiment 3 of the invention.

FIG. 17 shows the cross-sectional structure of a pad electrode portion serving as an external input/output terminal of a GaN-based semiconductor device of Embodiment 3. As is shown in FIG. 17, the principal plane of a wafer-like substrate 52 of, for example, SiC is partitioned into device formation regions 50 and a pad electrode formation region 51 adjacent to the device formation region 50.

In the device formation region 50 on the principal plane of the substrate 52, a multi-layer structure 53A of GaN-based semiconductors serving as an active layer of a transistor or the like is formed, and in the pad electrode formation region 51, an insulating oxide film 53B formed by oxidizing the multi-layer structure 53A and a pad electrode 54 of, for example, titanium (Ti)/gold (Au) disposed on the insulating oxide film 53B are formed. Although not shown in the drawing, it goes without saying that the pad electrode 54 is electrically connected to a device (not shown) formed in the device formation region 50 through a wire.

In this manner, the pad electrode 54 of this embodiment is formed above the multi-layer structure 53A of GaN-based semiconductors with the insulating oxide film 53B formed by oxidizing the multi-layer structure 53A sandwiched therebetween, and hence, adhesion between the pad electrode 54 and the substrate 52 can be improved. Accordingly, for example, the pad electrode 54 can be prevented from peeling off from the substrate 52 in wire-bonding the pad electrode 54.

Table 2 below shows results of quantitatively evaluating adhesion of a GaN layer epitaxially grown on a substrate of SiC to a variety of thin film materials and adhesion of an oxide film formed by oxidizing an upper portion of the GaN layer to a variety of thin film materials. This evaluation is made by a Sebastian method.

TABLE 2

| Sample structures | Tensile load (×9.8 N/cm$^2$) |
| --- | --- |
| Silicon oxide film on GaN layer | 350 |
| Silicon nitride film on GaN layer | 320 |
| GaN oxide layer on GaN | 1080 |
| Ti/Au multi-layer structure on GaN oxide layer | 850 |
| Al on GaN oxide layer | 830 |
| Silicon oxide film on GaN oxide layer | 920 |
| Silicon nitride film on GaN oxide layer | 900 |

It is understood from Table 2 that an insulating film having high adhesion on a GaN layer is merely a GaN oxide layer formed by oxidizing a GaN layer. Furthermore, it is understood that a GaN oxide layer has high adhesion to not only a metal material but also an insulating film including silicon. Accordingly, a pad electrode portion required to have high adhesion is very effectively formed on the insulating oxide film 53B obtained by oxidizing the multi-layer structure 53A of GaN-based semiconductors.

Although the substrate 52 is made from SiC in this embodiment, any substrate on which the multi-layer structure 53A of GaN-based semiconductors can be epitaxially grown, such as a sapphire substrate, may be used instead.

Now, a method of fabricating the pad electrode portion of a semiconductor device having the aforementioned structure will be described with reference to the accompanying drawings.

FIGS. 18A through 18C, 19A and 19B are cross-sectional views for showing procedures in the method of fabricating the pad electrode portion of a semiconductor device of this embodiment.

Figure 18A:
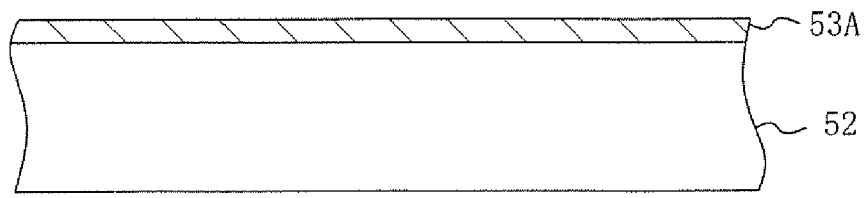
FIGS. 18A, 18B and 18C are cross-sectional views for showing procedures in a method of fabricating the semiconductor device of Embodiment 3.

First, as is shown in FIG. 18A, a multi-layer structure 53A of GaN/AlGaN is formed on a substrate 52 of SiC by, for example, the electron beam epitaxy (MBE).

Figure 18B:
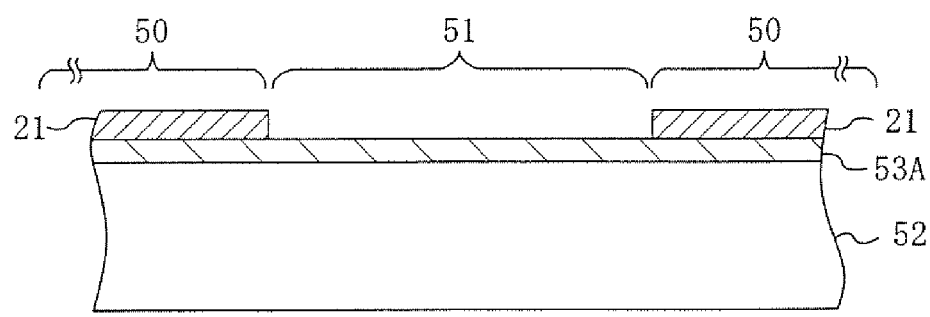

Next, as is shown in FIG. 18B, the entire surface of the multi-layer structure 53A is partitioned into device formation regions 50 and pad electrode formation regions 51. Subsequently, in the device formation region 50, a protection formation film of Si is formed on the multi-layer structure 53A by the CVD or the like. Thereafter, the protection formation film is patterned by the lithography into a protection film 21 covering the device formation region 50 on the substrate 52.

Figure 18C:
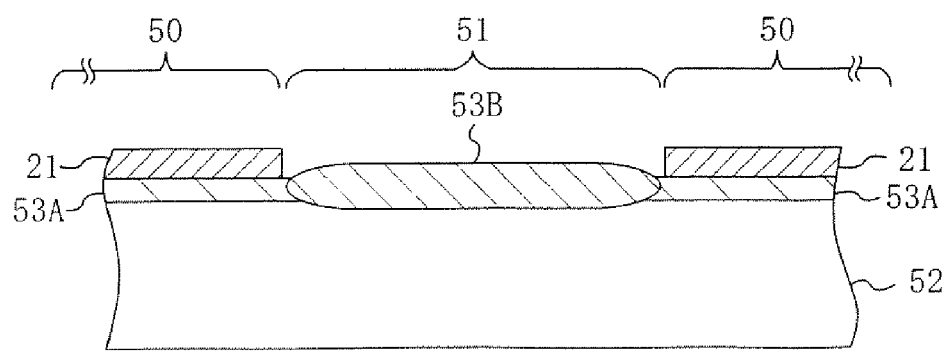

Then, as is shown in FIG. 18C, with the protection film 21 formed on the multi-layer structure 53A, a thermal treatment is carried out at approximately 900° C. in an oxygen ambient for approximately 1 hour, thereby oxidizing a portion of the multi-layer structure 53A in the pad electrode formation region 51 into an insulating oxide film 53B.

The insulating oxide film 53B may be formed before or after forming a semiconductor device such as a transistor in the device formation region 50, whereas it is preferably formed before forming the device for attaining a good device characteristic because the thermal treatment is carried out at a comparatively high temperature. In this case, the insulating oxide film 53B is formed in the same procedure for forming the protection film 21 shown in FIG. 4C of Embodiment 1 or shown in FIG. 15C of Embodiment 2.

Figure 19A:
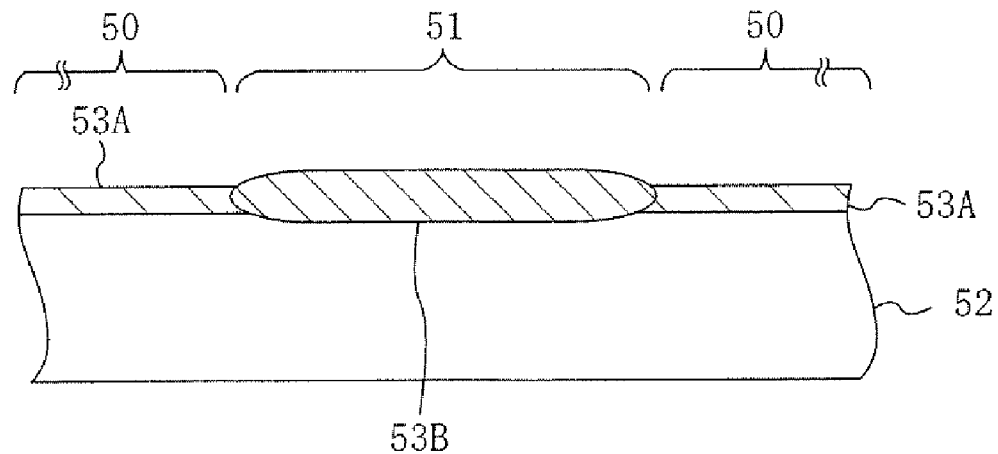
FIGS. 19A and 19B are cross-sectional views for showing other procedures in the method of fabricating the semiconductor device of Embodiment 3.
Figure 19B:
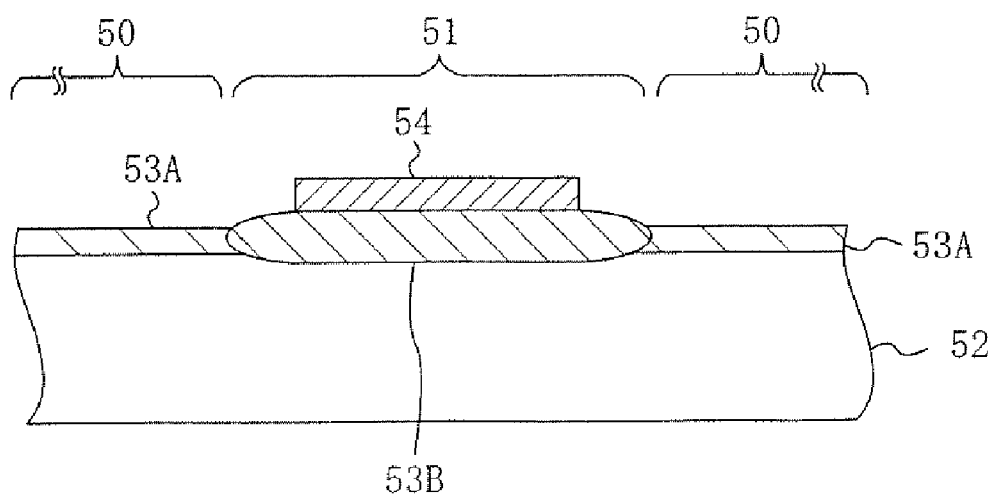

Subsequently, as is shown in FIG. 19A, the protection film 21 is removed by using nitric acid/hydrogen fluoride, and then, as is shown in FIG. 19B, a pad electrode 54 of Ti/Au is selectively formed on the insulating oxide film 53B in the pad electrode formation region 51 by, for example, the deposition and the lithography.

In this manner, the pad electrode 54 is formed on the insulating oxide film 53B obtained by oxidizing the multi-layer structure 53A of GaN-based semiconductors in this embodiment, and hence, high adhesion can be attained.

Although the pad electrode 54 is directly formed on the insulating oxide film 53B in this embodiment, an insulating film such as a silicon oxide film and a silicon nitride film may be disposed between the pad electrode 54 and the insulating oxide film 53B of an oxide of the GaN-based semiconductors because an insulating film including silicon has high adhesion to the oxide of the GaN-based semiconductors as is shown in Table 2.

Although the protection film 21 for protecting a portion of the multi-layer structure 53A in the device formation region 50 is made from silicon in this embodiment, any material capable of preventing degradation of the multi-layer structure 53A through the thermal treatment, such as a silicon oxide film and a silicon nitride film, may be used instead.

Although the protection film 21 is removed by the wet etching using nitric acid/hydrogen fluoride in this embodiment, another etchant may be used. Alternatively, the etching can be carried out by dry etching.

Furthermore, the insulating oxide film 53B may be formed, instead of in an oxygen ambient, by implanting oxygen ions into the multi-layer structure 53A.

Embodiment 4

Embodiment 4 of the invention will now be described with reference to the accompanying drawings.

Figure 20A:
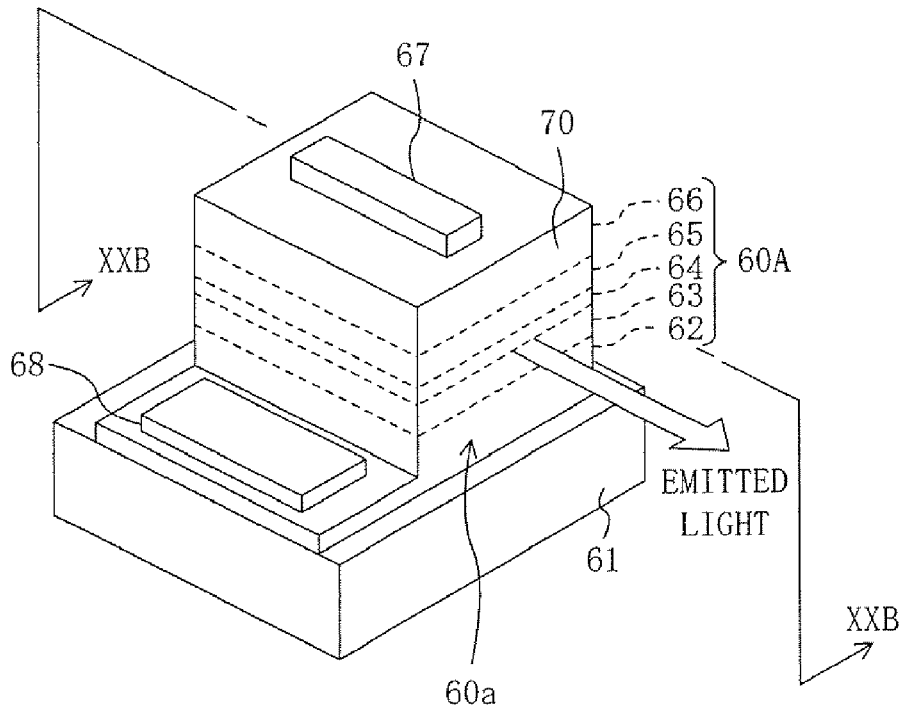
Figure 20B:
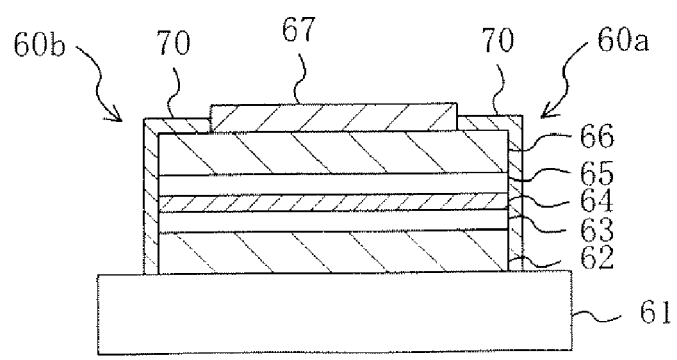

FIGS. 20A and 20B show a group III nitride semiconductor laser diode according to Embodiment 4 of the invention, wherein FIG. 20A is a perspective view thereof and FIG. 20B is a cross-sectional view thereof taken on line XXB-XXB of FIG. 20A. As is shown in FIG. 20A, the semiconductor laser diode of this embodiment includes the following layers successively formed on a substrate 61 of sapphire having the principal plane of the (0001) surface orientation: An n-type contact layer 62 of n-type gallium nitride (GaN); an n-type cladding layer 63 of n-type aluminum gallium nitride (AlGaN); an active layer 64 of gallium indium nitride (GaInN); a p-type cladding layer 65 of p-type aluminum gallium nitride (AlGaN); and a p-type contact layer 66. In this manner, the semiconductor laser diode has a laser structure 60A including a cavity of doublehetero junction in which the active layer 64 including In is vertically sandwiched between the n-type cladding layer 63 and the p-type cladding layer 65 including Al.

In this case, as is shown in FIGS. 20A and 20B, a direction in which an emitting facet 60a opposes a reflecting facet 60b of the laser structure 60A corresponds to a lasing direction of a laser beam in the cavity.

Also, as is shown in FIG. 20A, on the p-type contact layer 66, a p-side electrode 67 of, for example, nickel (Ni)/gold (Au) is formed. On the other hand, a part of the n-type contact layer 62 is exposed, so that an n-side electrode 68 of, for example, titanium (Ti)/aluminum (Al) can be formed on the exposed surface.

As a characteristic of the semiconductor laser diode of this embodiment, as is shown in the cross-sectional view of FIG. 20B along the emitting direction of a laser beam, the emitting facet 60a and the reflecting facet 60b working as cavity mirrors in the laser structure 60A are formed by etching the n-type cladding layer 63, the active layer 64 and the p-type cladding layer 65 in a direction vertical to the principal plane of the substrate 61, and the etched facets are covered with a protection oxide film 70 formed by oxidizing the facets. Accordingly, a substantial cavity facet corresponds to the interface between the end of the active layer 64 and the protection oxide film 70.

Since the cavity mirror does not remain as the etched facet but is covered with the protection oxide film 70 in this manner, the semiconductor laser diode of this embodiment is minimally affected by defects or the like caused in the etching. Furthermore, the protection oxide film 70 is formed by directly oxidizing the semiconductor layers included in the laser structure 60A, and hence, no leakage current is caused, resulting in attaining high reliability.

Moreover, since there is no need to provide a coating on the cavity facet in the semiconductor laser diode of this embodiment, the number of fabrication processes can be reduced. It is necessary to optimize the reflectance of a laser beam on the emitting facet and the reflecting facet by adjusting the thickness of the protection oxide film 70 or the like.

Now, a method of fabricating the semiconductor laser diode having the aforementioned structure will be described with reference to the accompanying drawings.

Figure 21A:
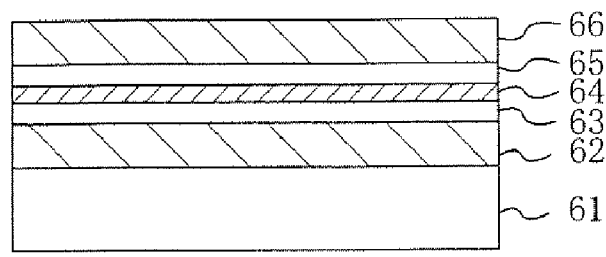
Figure 21B:
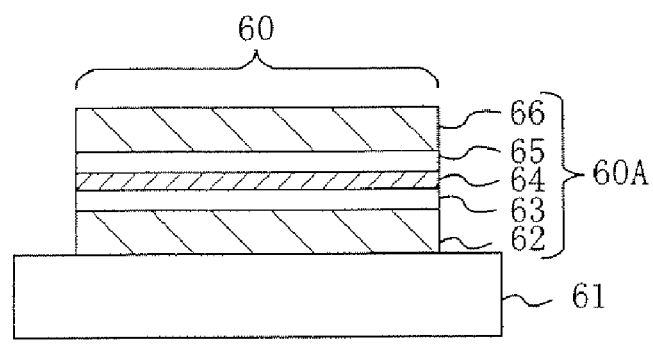
Figure 21C:
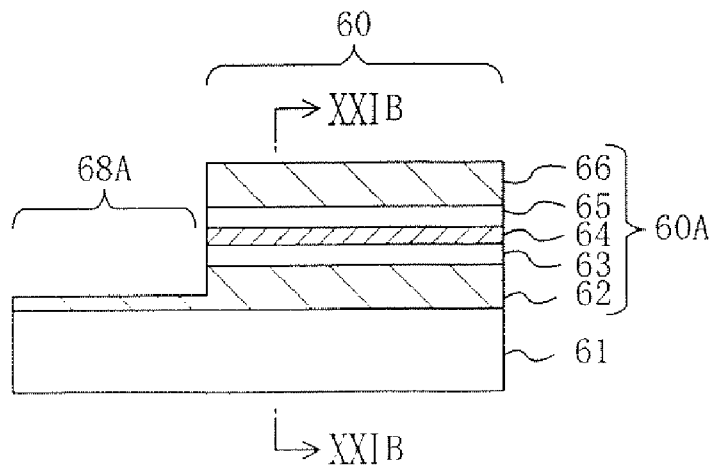

FIGS. 21A through 21C and 22A through 22D are cross-sectional views for showing procedures in the method of fabricating the semiconductor laser diode of this embodiment. In these drawings, the cross-sectional structure taken on line XXB-XXB of FIG. 20A is shown, whereas FIG. 21C is a front view.

First, as is shown in FIG. 21A, an n-type contact layer 62, an n-type cladding layer 63, an active layer 64, a p-type cladding layer 65 and a p-type contact layer 66 are successively grown on a substrate 61 of sapphire by, for example, the metal organic vapor phase epitaxy (MOVPE).

Next, as is shown in the cross-sectional view of FIG. 21B and the front view of FIG. 21C, the p-type contact layer 66, the p-type cladding layer 65, the active layer 64 and the n-type cladding layer 63 are etched with a laser structure formation region 60 masked by, for example, electron cyclotron resonance (ECR) etching until the n-type contact layer 62 is exposed. Thus, a laser structure 60A including the n-type contact layer 62, the n-type cladding layer 63, the active layer 64, the p-type cladding layer 65 and the p-type contact layer 66 is formed, and an n-side electrode formation region 68A is formed in the n-type contact layer 62.

Figure 22A:
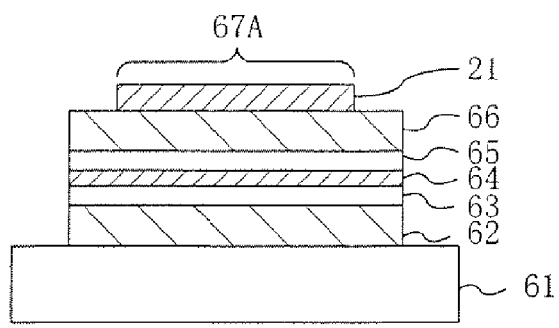
FIGS. 22A, 22B, 22C and 22D are cross-sectional views for showing other procedures in the method of fabricating the semiconductor laser diode of Embodiment 4.

Then, as is shown in the cross-sectional view of FIG. 22A, a protection film 21 of silicon (Si) is selectively formed so as to cover a p-side electrode formation region 67A and the n-side electrode formation region (not shown).

Figure 22B:
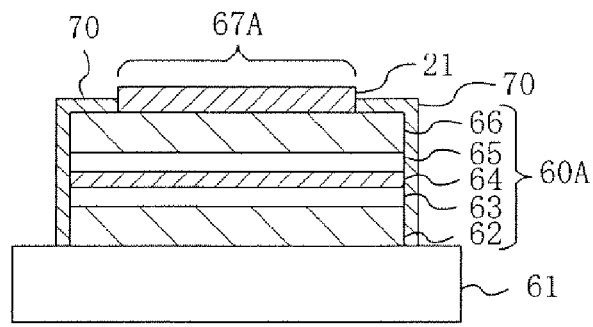

Subsequently, as is shown in FIG. 22B, with the protection film 21 formed on the laser structure 60A, a thermal treatment is carried out at approximately 900° C. in an oxygen ambient for approximately 1 hour, thereby forming a protection oxide film 70 on the top face and side faces excluding the p-side electrode formation region 67A and the n-side electrode formation region of the laser structure 60A by oxidizing corresponding portions of the laser structure 60A.

Figure 22C:
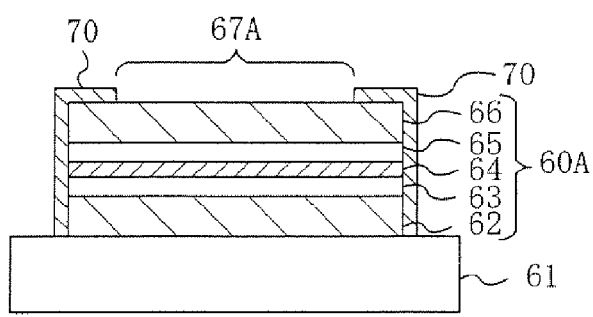

Next, as is shown in FIG. 22C, the protection film 21 is removed by using nitric acid/hydrogen fluoride, thereby exposing the p-side electrode formation region 67A on the p-type contact layer and the n-side electrode formation region.

Figure 22D:
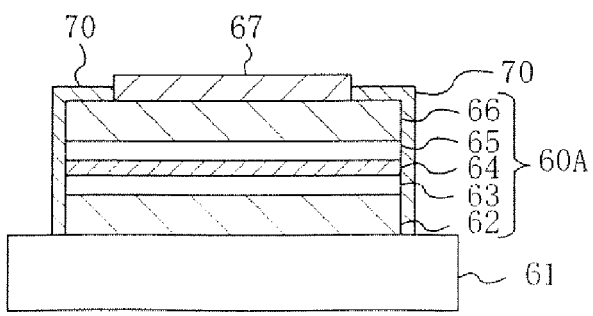

Then, as is shown in FIG. 22D, a p-side electrode 67 is formed in the p-side electrode formation region 67A, and an n-side electrode is formed in the n-side electrode formation region. In this manner, the semiconductor laser diode of FIG. 20A is completed.

In the fabrication method of this embodiment, since the GaN-based semiconductor layers included in the laser structure 60A and their etched facets are oxidized, there is no need to provide coatings on the emitting facet 60a and the reflecting facet 60b, and the cavity mirrors can be formed on the interfaces between the protection oxide film 70 and the laser structure 60A.

In the semiconductor laser diode of this embodiment, the active layer 64 may be formed into a striped shape or the p-type cladding layer 65 may be provided with a current confining layer in order to improve controllability in the lateral mode of the laser beam.

Although the protection film 21 for masking the p-side electrode formation region 67A and the n-side electrode formation region 68A in forming the protection oxide film 70 is made from silicon in this embodiment, any material capable of preventing degradation of the p-type contact layer 66 and the n-type contact layer 62 through the thermal treatment, such as a silicon oxide film and a silicon nitride film, may be used instead.

Although the protection film 21 is removed by the wet etching using nitric acid/hydrogen fluoride in this embodiment, another etchant may be used. Alternatively, the etching can be carried out by dry etching.

Although the substrate 61 is made from sapphire in this embodiment, any other substrate on which GaN-based semiconductor layers can be epitaxially grown, such as SiC, may be used instead of the sapphire substrate.

What is claimed is:

1. A method of fabricating a semiconductor device comprising:
   a semiconductor layer forming step of forming a group III nitride semiconductor layer on a substrate;
   a protection film forming step of forming, on said group III nitride semiconductor layer, a protection film for covering an active region of said group III nitride semiconductor layer;
   an oxide film forming step of forming, in a region on said substrate excluding said active region, an insulating oxide film by oxidizing said group III nitride semiconductor layer with said protection film used as a mask; and
   an active region exposing step of exposing said active region by removing said protection film.

2. The method of fabricating a semiconductor device of claim 1, further comprising, after said active region exposing step:
   an ohmic electrode forming step of forming an ohmic electrode on said active region; and
   a gate electrode forming step of forming, on said active region, a gate electrode extending onto said insulating oxide film.

3. The method of fabricating a semiconductor device of claim 1, further comprising, between said semiconductor layer forming step and said protection film forming step, an ammonia treatment step of exposing said group III nitride semiconductor layer to ammonia.

4. The method of fabricating a semiconductor device of claim 2,
   wherein said ammonia treatment step includes a sub-step of changing said ammonia into plasma.

5. The method of fabricating a semiconductor device of claim 1,
   wherein said protection film is formed from silicon, silicon oxide or silicon nitride.

6. The method of fabricating a semiconductor device of claim 1,
   wherein said oxide film forming step includes a sub-step of conducting a thermal treatment on said group III nitride semiconductor layer in an oxygen ambient.

7. The method of fabricating a semiconductor device of claim 1,
   wherein said oxide film forming step includes a sub-step of conducting a thermal treatment on said group III nitride semiconductor layer with oxygen ions implanted.

8. A method of fabricating a semiconductor device comprising:
   a semiconductor layer forming step of forming a group III nitride semiconductor layer on a substrate in a water state;
   a region setting step of setting, in said group III nitride semiconductor layer, a plurality of device formation regions where devices are to be formed on said group III nitride semiconductor layer and a scribe region for use in dividing said substrate into chips respectively including said device formation regions;
   a protection film forming step of forming, on said scribe region, a protection film for covering said scribe region; and
   an oxide film forming step to forming, in a region on sides of said scribe region on said substrate, a protection oxide film by oxidizing said group III nitride semiconductor layer with said protection film used as a mask.

9. The method of fabricating a semiconductor device of claim 8,
   wherein said protection film is formed from silicon, silicon oxide or silicon nitride.

10. The method of fabricating a semiconductor device of claim 8,
   wherein said oxide film forming step includes a sub-step of conducting a thermal treatment on said group III nitride semiconductor layer in an oxygen ambient.

11. The method of fabricating a semiconductor device of claim 8,
   wherein said oxide film forming step includes a sub-step of conducting a thermal treatment on said group III nitride semiconductor layer with oxygen ions implanted.

12. A method of fabricating a semiconductor device comprising:
   a semiconductor layer forming step of forming a group III nitride semiconductor layer on a substrate;
   a region setting step of setting, in said group III nitride semiconductor layer, a device formation region where a device is to be formed on said group III nitride semiconductor layer and a pad electrode formation region for external connection of said device to be formed in said device formation region;
   a protection film forming step of forming a protection film covering a region on said group III nitride semiconductor layer excluding said pad electrode formation region;
   an oxide film forming step of forming an insulating oxide film in said pad electrode formation region on said substrate by oxidizing said group III nitride semiconductor layer with said protection film used as a mask; and
   a step of forming a pad electrode on said insulating oxide film.

13. The method of fabricating a semiconductor device of claim 12,
   wherein said oxide film forming step includes a sub-step of conducting a thermal treatment on said group III nitride semiconductor layer in an oxygen ambient.

14. The method of fabricating a semiconductor device of claim 12,
   wherein said oxide film forming step includes a sub-step of conducting a thermal treatment on said group III nitride semiconductor layer with oxygen ions implanted.

15. A method of fabricating a semiconductor device comprising:
   a laser structure forming step of forming, on a substrate, a laser structure having a cavity and including a plurality of group III nitride semiconductor layers by forming said plurality of group III nitride semiconductor layers;
   a step of exposing facets of said cavity of said laser structure; and
   an oxide film forming step of forming a protection oxide film on said facets by oxidizing side faces of said laser structure including said facets.

16. The method of fabricating a semiconductor device of claim 15,
   wherein said oxide film forming step includes a sub-step of conducting a thermal treatment on said group III nitride semiconductor layers in an oxygen ambient.

* * * * *